US009241375B2

(12) United States Patent
Inoguchi

(10) Patent No.: US 9,241,375 B2
(45) Date of Patent: Jan. 19, 2016

(54) LIGHT-EMITTING APPARATUS PACKAGE, LIGHT-EMITTING APPARATUS, BACKLIGHT APPARATUS, AND DISPLAY APPARATUS

(71) Applicant: Sharp Kabushiki Kaisha, Osaka-shi (JP)

(72) Inventor: Tsukasa Inoguchi, Kitakatsuragi-gun (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 100 days.

(21) Appl. No.: 14/085,289

(22) Filed: Nov. 20, 2013

(65) Prior Publication Data

US 2014/0124823 A1 May 8, 2014

Related U.S. Application Data

(60) Continuation of application No. 13/830,059, filed on Mar. 14, 2013, now Pat. No. 8,629,476, which is a division of application No. 13/222,739, filed on Aug. 31, 2011, now Pat. No. 8,421,109, which is a division (Continued)

(30) Foreign Application Priority Data

Apr. 1, 2003 (JP) .................................. 2003-098554
Apr. 8, 2003 (JP) .................................. 2003-104669

(51) Int. Cl.
*H01L 33/00* (2010.01)
*H05B 33/06* (2006.01)

(Continued)

(52) U.S. Cl.
CPC ................ *H05B 33/06* (2013.01); *H01L 24/97* (2013.01); *H01L 25/0753* (2013.01);

(Continued)

(58) Field of Classification Search
CPC .................. H01L 2924/00; H01L 2224/48091;
H01L 2924/00014; H01L 2924/12041; H01L 33/62; H01L 2224/45144; H01L 2224/48227; H01L 33/486; H01L 25/0753; H01L 33/641; H01L 33/46
USPC ................................. 257/98, 99, 88, E33.072
See application file for complete search history.

(56) References Cited

U.S. PATENT DOCUMENTS 7,030,423 B2   4/2006 Chang et al.
2002/0175621 A1   11/2002 Song et al.
(Continued)

FOREIGN PATENT DOCUMENTS

JP   59-214279    12/1984
JP   63-226080    9/1988
(Continued)

OTHER PUBLICATIONS

Inoguchi, U.S. Office Action mailed Dec. 10, 2008, directed to U.S. Appl. No. 10/816,736; 6 pages.
(Continued)

*Primary Examiner* — Thien F Tran
(74) *Attorney, Agent, or Firm* — Morrison & Foerster LLP

(57) ABSTRACT

A light-emitting apparatus package of the present invention includes (i) an electrically insulated ceramic substrate, (ii) a first concave section formed in the direction of thickness of the ceramic substrate so as to form a light exit aperture in a surface of the ceramic substrate, (iii) a second concave section formed within the first concave section in the further direction of thickness of the ceramic substrate so that one or more light-emitting devices are provided therein, (iv) a wiring pattern for supplying electricity, which is provided in the first concave section, and (v) a metalized layer having light-reflectivity, which is (a) provided between the light-emitting device and the surface of the second concave section of the substrate, and (b) electrically insulated from the wiring pattern.

14 Claims, 31 Drawing Sheets

Related U.S. Application Data of application No. 12/540,220, filed on Aug. 12, 2009, now Pat. No. 8,030,675, which is a division of application No. 10/816,736, filed on Apr. 1, 2004, now Pat. No. 7,579,629.

(51) Int. Cl.
  *H01L 25/075* (2006.01)
  *H01L 33/48* (2010.01)
  *H01L 23/00* (2006.01)
  *H01L 33/46* (2010.01)
  *H01L 33/62* (2010.01)
  *H01L 33/64* (2010.01)

(52) U.S. Cl.
  CPC .............. *H01L 33/486* (2013.01); *H01L 33/46* (2013.01); *H01L 33/62* (2013.01); *H01L 33/641* (2013.01); *H01L 2224/45144* (2013.01); *H01L 2224/48227* (2013.01); *H01L 2924/12041* (2013.01); *H01L 2924/15787* (2013.01); *H01L 2924/351* (2013.01)

(56) References Cited

U.S. PATENT DOCUMENTS

| | | | |
|---|---|---|---|
| 2004/0173808 | A1 | 9/2004 | Wu |
| 2005/0174801 | A1 | 8/2005 | Cao |
| 2005/0184387 | A1* | 8/2005 | Collins et al. ................ 257/712 |

FOREIGN PATENT DOCUMENTS

| | | |
|---|---|---|
| JP | 4-105562 | 9/1992 |
| JP | 5-8959 | 2/1993 |
| JP | 5-275750 | 10/1993 |
| JP | 6-77540 | 3/1994 |
| JP | 6-230731 | 8/1994 |
| JP | 7-38154 | 2/1995 |
| JP | 9-45965 | 2/1997 |
| JP | 9-96811 | 4/1997 |
| JP | 10-190066 | 7/1998 |
| JP | 11-177136 | 7/1999 |
| JP | 2001-160312 | 6/2001 |
| JP | 2001-284659 | 10/2001 |
| JP | 3083557 | 2/2002 |
| JP | 2002-232017 | 8/2002 |
| JP | 2002-246650 | 8/2002 |
| JP | 2002-246652 | 8/2002 |
| JP | 2002-252373 | 9/2002 |
| JP | 2002-314149 | 10/2002 |
| JP | 2004-235204 | 8/2004 |

OTHER PUBLICATIONS

Inoguchi, U.S. Office Action mailed May 22, 2008, directed to U.S. Appl. No. 10/816,736; 8 pages.

Inoguchi, U.S. Office Action mailed May 4, 2007, directed to U.S. Appl. No. 10/816,736; 6 pages.

Inoguchi, U.S. Office Action mailed Oct. 25, 2007, directed to U.S. Appl. No. 10/816,736; 8 pages.

Inoguchi, U.S. Office Action mailed Jan. 20, 2011, directed to U.S. Appl. No. 12/540,220; 5 pages.

Inoguchi, U.S. Office Action mailed Aug. 10, 2012, directed to U.S. Appl. No. 13/222,739; 6 pages.

Inoguchi, T., Notice of Allowance mailed Sep. 17, 2013, directed to U.S. Appl. No. 13/830,059; 8 pages.

* cited by examiner

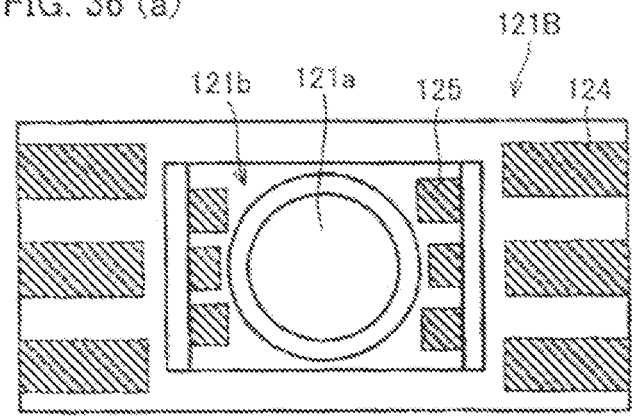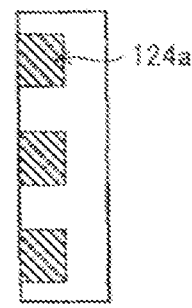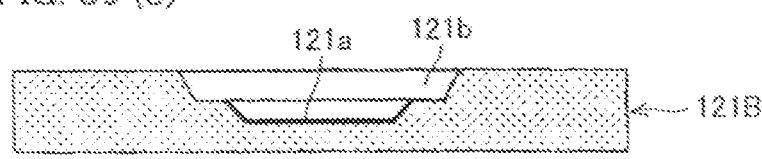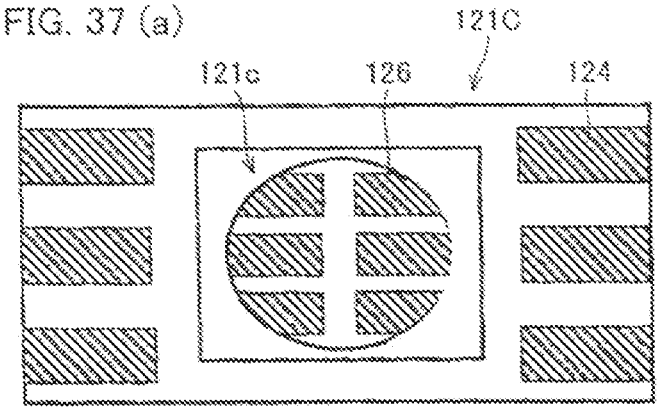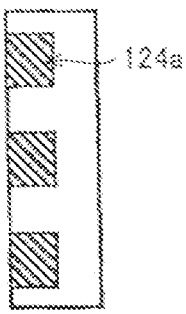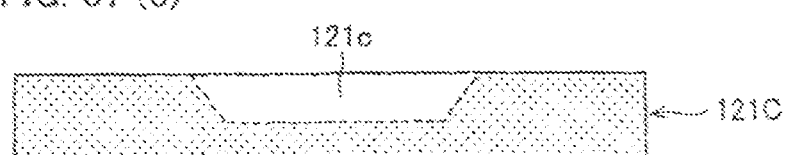

LIGHT-EMITTING APPARATUS PACKAGE, LIGHT-EMITTING APPARATUS, BACKLIGHT APPARATUS, AND DISPLAY APPARATUS

CROSS-REFERENCE TO RELATED APPLICATIONS

This application is a continuation of U.S. Ser. No. 13/830,059, filed Mar. 14, 2013, which is a divisional application of U.S. Ser.No. 13/222,739, filed Aug. 31, 2011, which is a divisional application of U.S. Ser. No. 12/540,220, filed Aug. 12, 2009 and issued Oct. 4, 2011 as U.S. Pat. No. 8,030,675, which is a divisional application of U.S. Ser. No. 10/816,736, filed Apr. 1, 2004 and issued Aug. 25, 2009 as U.S. Pat. No. 7,579,629, and which claims priority under 35 U.S.C. §119 (a) on Patent Application No. 2003/098554 filed in Japan on Apr. 1, 2003, and Patent Application No. 2003/104669 filed in Japan on Apr. 8, 2003, the entire contents of which are hereby incorporated by reference.

FIELD OF THE INVENTION

The present invention relates to (i) a light-emitting apparatus package for a light source, driven by a large current intensity, such as a backlight source, such as a light-emitting diode, used for a liquid crystal display (LCD) and an illumination light source, (ii) a light-emitting apparatus in which the light-emitting apparatus package is used, (iii) a backlight apparatus in which the light-emitting apparatus is used, and (iv) a display apparatus in which the backlight apparatus is used.

BACKGROUND OF THE INVENTION

In a conventional light-emitting apparatus of surface-mounted type, light-emitting device as shown in FIG. 62 and FIG. 63, a light-emitting device 3 such as a light-emitting diode (LED) is provided on an electrically insulated substrate 1, which is made of a resin such as a glass-fiber-added epoxy resin. On a surface of the electrically insulated substrate 1, an electric wiring pattern is provided. On the light-emitting device 3, an Au wire 4 is provided. Then, the light-emitting device 3 and the Au wire 4 are sealed with a transparent resin 5 by carrying out a molding such as a transfer-molding. The insulated substrate 1 has a shape of a flat plate.

In another conventional light-emitting apparatus of surface-mounted type, as shown in FIG. 64 and FIG. 65, lead frames 6 are insert-molded in a resin substrate 7. On the insert-molded lead frames 6, light-emitting devices 3, 8, and 9 are provided, respectively, so as to be connected to the insert-molded lead frames 6 via Au wires 4. Then, a cup section of the light-emitting apparatus is sealed with a resin such as an epoxy resin. Alternatively, it may be arranged such that an electric wiring pattern is provided on the surface of the resin substrate 7, instead of the lead frames 6.

FIG. 66 and FIG. 67 are cross sectional views illustrating optical paths during the light emitting, respectively. According to another conventional arrangement, a reflective case whose center has a space is provided on the electrically insulated substrate 1 shown in FIG. 62. In the space of the reflective case, a light-emitting device is provided, and a plastic molding is formed in the space. Note that this arrangement is consequently similar to the arrangement shown in FIG. 64.

Further, in Japanese Publication for Utility Model No. 5-8959 (Jitsukaihei 5-8959, published on Feb. 5, 1993), disclosed is a light-emitting device package. The package includes a rectangular electrically insulated substrate having a light-emitting device in its concave portion. In one side surface of the substrate, a first groove is provided so as to bridge an upper surface of the substrate and a bottom surface of the substrate. In the other side surface of the substrate, a second groove is provided so as to bridge the upper surface of the substrate and a second surface of the concave portion. With the package, the first groove allows the polarity of the light-emitting device to be recognized because of its appearance, thereby enabling the light-emitting device to function properly.

Further, in Japanese Publication for Unexamined Patent Application No. 2002-246650 (Tokukai 2002-246650, published on Aug. 30, 2002), disclosed is a light-emitting diode apparatus in which (i) an electric wiring pattern is provided, by using the MID method, in an electrically insulated cup section, and (ii) a light-emitting diode is provided on the electric wiring pattern. According to the light-emitting diode apparatus, it is possible to avoid the breaking of wire caused by the stress exerted in a lamp-type lead frame due to the resin.

Further, in Japanese Publication for Utility Model No. 4-105562 (Jitsukaihei 4-105562, published on Sep. 10, 1992) disclosed is a light-emitting device package in which (i) a metal reflective film is adherently provided in a wall of a concave portion of a black-colored electrically insulated substrate, and (ii) a light-emitting diode is provided in the concave portion. According to the light-emitting device package, light does not leak into adjacent concave portions. Accordingly, characters and images can be clearly displayed.

Furthermore, in Japanese Publication for Unexamined Patent Application No. 6-77540 (Tokukaihei 6-77540, published on Mar. 18, 1994), disclosed is an optical semiconductor apparatus including (i) a substrate, (ii) an optical semiconductor provided on the substrate, and (iii) a reflector made of a thick film provided so as to surround the optical semiconductor, the reflector having a shape of substrate. According to the optical semiconductor apparatus, since the thick film is provided on the substrate, the optical semiconductor apparatus has an excellent adhesiveness to the substrate, thereby making the size of the optical semiconductor apparatus smaller.

Further, a semiconductor apparatus is disclosed in Japanese Publication for Unexamined Patent Application No. 2002-314149 (Tokukai 2002-314149, published in on Oct. 25, 2002). In the semiconductor apparatus, (i) a cavity having a stair-like structure is provided, (ii) a metal plate on which an optical semiconductor device is provided is provided on the cavity wall, and (iii) a semiconductor element for controlling is provided on the bottom surface of the metal plate. With the semiconductor apparatus, it is possible to prevent the malfunction of the semiconductor element due to the light from the optical semiconductor device. Also the semiconductor apparatus can be contained in a smaller package.

In the foregoing conventional arts, the emission of the light-emitting device 3 such as an LED is carried out in response to the current supplied to the light-emitting device 3. Accordingly, the luminosity increases as the amount of current increases. However, the increasing in the current causes the generated heat value of the light-emitting device 3 to increase, accordingly, such that the light-emitting device 3 receives the heat stress. On this account, luminosity increases less than expected and the reliability is affected adversely.

Therefore, in order to discharge the heat, a radiator is provided on the wiring substrate having the light-emitting device 3. However, in FIG. 68, a wiring substrate 32 is disposed between the light-emitting device 3 serving as heating element and the radiator 33. The wiring substrate 32 has heat conductivity that is as poor as the substrate 1 made of a resin. Accordingly, the effect of the radiator significantly decreases. The effect of the heat discharging in the arrangement in FIG. 69 significantly also decreases in the same manner as in the arrangement in FIG. 68.

Furthermore, because the light-emitting apparatus is required to be downsized, the thickness of a support section of the light-emitting device becomes thinner. On this account, there is a possibility that the light passes through the support section although it depends on the material of the support section. This raises a problem that efficiency of light irradiating to an intended direction decreases.

SUMMARY OF THE INVENTION

An object of the present invention is to provide (i) a light-emitting apparatus package which causes luminosity, stability, radiation property of the light-emitting device to be improved, (ii) alight-emitting apparatus in which the light-emitting apparatus package is used, (iii) a backlight apparatus in which the light-emitting apparatus package is used, (iv) a display apparatus in which the light-emitting apparatus package is used.

To achieve the object, a light-emitting apparatus package of the present invention includes: a ceramic substrate having an electric insulating property and a good heat conductivity; a first concave section recessed in a thickness direction of the ceramic substrate, the first concave section providing a light exist aperture on a top surface of the ceramic substrate; a second concave section, provided in the first concave section, and further recessed in the thickness direction of the ceramic substrate, the second concave section for providing an area for mounting a light-emitting device; a wiring pattern provided in at least one of the first concave section and the second concave section, the wiring pattern for supplying electricity to the light-emitting device; and a metalized layer, (i) provided on an internal surface of the concave sections (inside-concave-section) of the ceramic substrate in such a manner that the area for mounting the light-emitting device is sandwiched between the metalized layer and the light exit aperture, and in such a manner that the metalized layer is electrically insulated from the wiring pattern, the metalized layer having a light reflective property.

According to the arrangement in which the first concave section and the second concave section are provided, the light-emitting device, the wiring pattern, and connecting members which connect the light-emitting device to the wiring pattern are provided in the first concave section and the second concave section. On the account of this, a size of the light-emitting apparatus can be smaller and it is possible to secure the connections carried out by the connecting members become firm. Also, because the metalized layer is made of a metal, the metalized layer has better heat conductivity than a ceramic substrate.

Further, according to the arrangement in which the metalized layer made from silver plating or the like is provided between the light-emitting device and the surface of the second concave section of the substrate, heat generated due to light emittance by the light-emitting device can be efficiently discharged to outside via the metalized layer and the ceramic substrate. On the account of this, the light-emitting device can stably emit light.

Furthermore, according to the arrangement in which the metalized layer is provided between the light-emitting device and the surface of the second concave section of the substrate, even though light emitted from the light-emitting device is reflected to the opposite direction to the light exit aperture—in other words, the light becomes stray light—, the metalized layer reflects the stray light toward the light exit aperture, thereby improving efficiency in utilizing the light emitted from the light-emitting device.

To achieve the object, a light-emitting apparatus of the present invention includes a light-emitting device, provided in the second concave section, the light-emitting device having an electrode on that part of the inside-concave-section surface in which no light-emitting device is provided; a wire for electrically connecting the wiring pattern and the electrode of the light-emitting device; and a transparent resin section for sealing the light-emitting device and the wire, the transparent resin having light transmitting property.

According to the arrangement in which any one of the light-emitting apparatus package described above is used, heat generated when the light-emitting device emits light can be efficiently discharged to outside via the metalized layer and the ceramic substrate. On the account of this, the light-emitting device can stably emit light.

Further, according to the arrangement in which the metalized layer having proper heat-reflectivity is provided between the light-emitting device and the surface of the second concave section of the substrate, even though light emitted from the light-emitting device is reflected to the opposite direction to the light exit aperture—in other words, the light becomes stray light—, the metalized layer reflects the stray light again to the light exit aperture, thereby improving efficiency that light emitted from the light-emitting device is utilized.

To achieve the object, another light-emitting apparatus of the present invention includes (i) one or more light-emitting devices for emitting light by converting a current into the light, (ii) at least one light-emitting device substrate on a first surface of which at least one of the one or more of the light-emitting devices is provided, (iii) a heat-discharging member bonded to at least one of a second surface and third surfaces of the light-emitting device substrate.

To achieve the object, a backlight apparatus of the present invention includes a light-emitting apparatus; and a light guide plate whose light-receiving end face faces a light-emitting part of the light-emitting apparatus, the light guide plate propagating therethrough light received on the light-receiving end face, and then emitting the light from a surface.

To achieve the object, a display apparatus of the present invention includes a display panel having a pair of substrates, which sandwich a displaying medium therebetween, the display panel displaying by applying a display voltage between the substrates; and the backlight apparatus provided on a bottom surface of the display panel.

Thereinafter, effect of the present invention in accordance with the foregoing arrangement is explained. In the present invention, only a light-emitting device substrate (for example, a ceramic substrate) is provided between a light-emitting device (for example, a light-emitting diode; referred to as a LED chip) and a heat-discharging member (heat-discharging element). The arrangement is much simpler than an arrangement of a conventional art in which a connecting substrate made of resin is additionally provided between the light-emitting device and the heat-discharging member. With such a simpler arrangement, heat is conducted more efficiently to the heat-discharging element from the LED chip. Therefore, according to the arrangement, it is possible to prevent the LED chip from being heated up to a high temperature, thereby avoiding luminosity from being deteriorated by heat. On the account of this, deterioration of the LED chip with time can be alleviated.

Further, in case where the light-emitting device substrate is, for example, a ceramic substrate instead of a resin substrate, which is used in a light-emitting device substrate of the conventional arts, heat is more efficiently conducted to the heat-discharging apparatus from the LED chip.

For a fuller understanding of the nature and advantages of the invention, reference should be made to the ensuing detailed description taken in conjunction with the accompanying drawings.

BRIEF DESCRIPTION OF THE DRAWINGS

FIG. 34(a) is a plan view, FIG. 34(b) is a side view, and FIG. 34(c) is a cross sectional view.

FIG. 36 shows the ceramic substrate in FIG. 34, FIG. 36(a) is a plan view, FIG. 36(b) is a side view, and FIG. 36(c) is a cross sectional view.

FIGS. 37(a) to 37(c) show how the ceramic substrate shown in FIG. 36 is arranged, FIG. 37(a) is a plan view, FIG. 37(b) is a side view, and FIG. 37(c) is a cross sectional view.

FIG. 38(a) is a plan view, FIG. 38(b) is a side view, and FIG. 38(c) is a cross sectional view.

FIG. 39(a) is a plan view illustrating a one example of the connecting substrate. FIG. 39(b) is a plan view illustrating another example of the connecting substrate.

DESCRIPTION OF THE EMBODIMENTS

Figure 1:
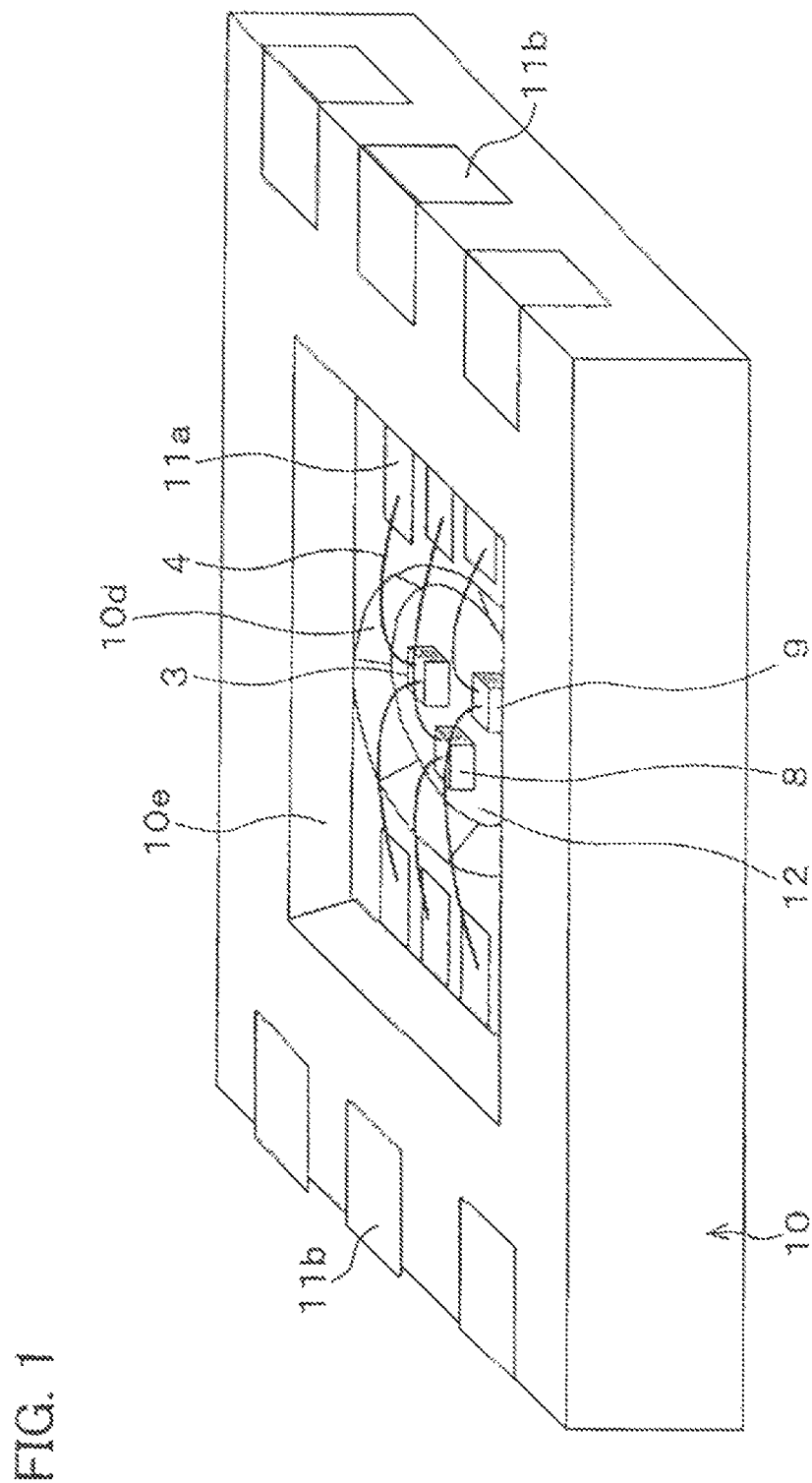
FIG. 1 is a perspective view illustrating a light-emitting apparatus in accordance with First Embodiment of the present invention.
Figure 56:
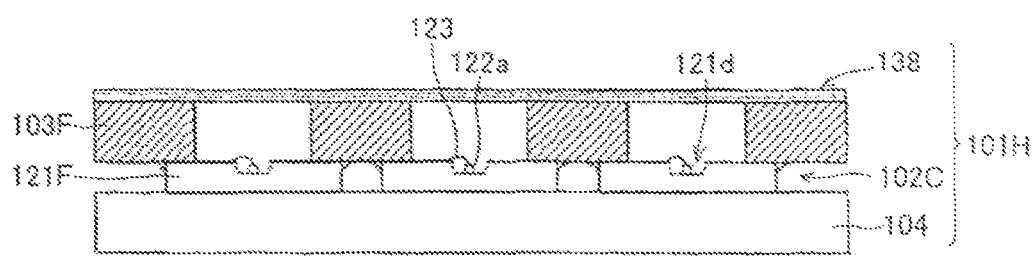
FIG. 56 is a cross sectional view illustrating an arrangement in an LED lighting apparatus of Thirteenth Embodiment of the present invention.

The following description deals with respective embodiments in accordance with the present invention with reference to FIG. 1 through FIG. 56.

[First Embodiment]

Figure 2:
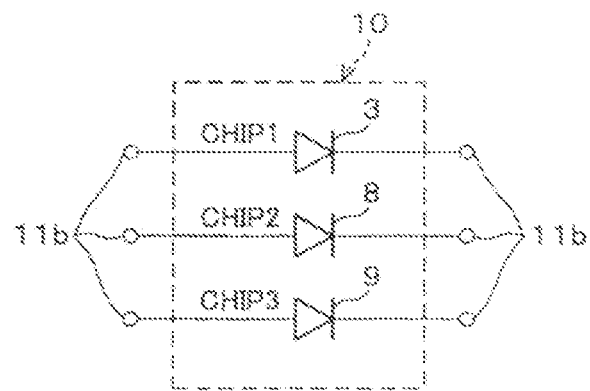
FIG. 2 is a circuit diagram showing respective light-emitting devices of the light-emitting apparatus.

As shown in FIG. 1 and FIG. 2, a light-emitting apparatus in accordance with the present invention includes a plurality of light-emitting devices, for example three light-emitting devices 3, 8, and 9 in a light-emitting apparatus package of ceramic substrate type in accordance with the present invention. The light-emitting devices 3, 8, and 9 are exemplified by rectangular-shaped LED and semiconductor laser.

The light-emitting apparatus package includes (i) a ceramic substrate 10 having electric insulation and good thermal conduction, (ii) a first concave section 10e formed by hollowing out the ceramic substrate 10 in its thickness direction such that a light exit aperture is provided, (iii) a second concave section 10d formed by further hollowing out the first concave section 10e in the thickness direction such that the light-emitting devices 3, 8, and 9 are provided therein, and (iv) wiring patterns 11a, provided in the first concave section 10e, for supplying electric power to the respective light-emitting devices 3, 8, and 9. In other words, the wiring pattern 11a is provided on an upper surface (first surface; light-emitting surface) of the ceramic substrate 10, i.e., on a side of a surface on which the light-emitting devices 3, 8, and 9 are provided.

The light-emitting apparatus package includes a metallized layer 12 that provided on an inside-concave-section surface of the ceramic substrate in such a manner that the area for mounting the light-emitting device is sandwiched between the metalized layer and the light exit aperture, and in such a manner that the metalized layer is electrically insulated from the wiring pattern, the metalized layer having a light reflective property. The light exit aperture corresponds to an opening section of the first concave section 10e of the ceramic substrate 10.

Figure 3:
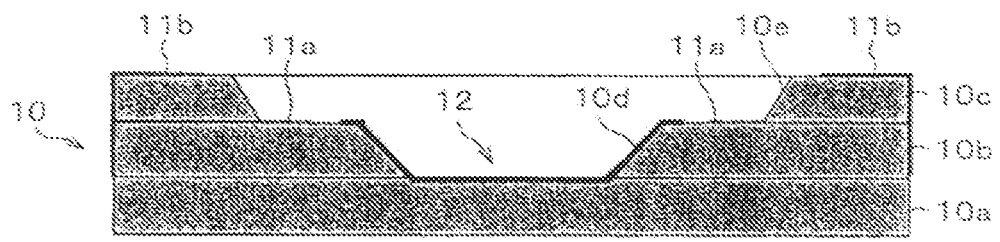
FIG. 3 is a cross sectional view illustrating a light-emitting apparatus package used for the light-emitting apparatus.
Figure 4:
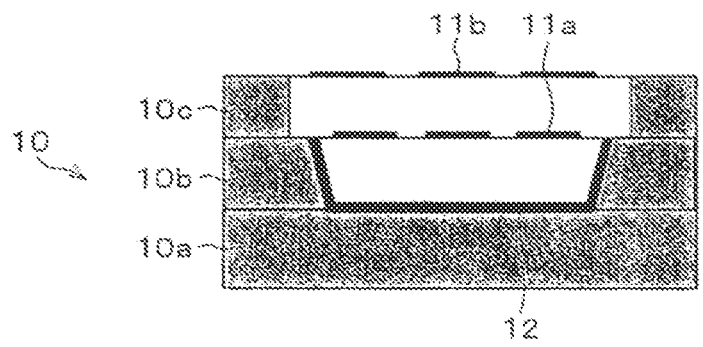
FIG. 4 is another cross sectional view illustrating a light-emitting apparatus package used for the light-emitting apparatus.

In the following description, the above light-emitting apparatus package is described based on the steps of manufacturing the package. As shown in FIG. 3 and FIG. 4, the ceramic substrate 10, which is molded so as to have a shape of substantially a rectangle, includes multiple layers—for example, three layers—of ceramic substrates 10a, 10b, 10c which are tightly layered one another in the thickness direction. The ceramic substrates 10a, 10b and 10c are made of a material such as silicon carbide (SiC), alumina ($Al_2O_3$), or aluminum nitride (AlN) that is electrical insulator and has a good thermal conduction. Of those materials, AlN is preferably used because AlN is easily molded.

The word "electrical insulator" means a resistance (RT) of not less than $10^{10}$ ($\Omega \cdot cm$), more preferably, a resistance (RT) of not less than $10^{12}$ ($\Omega \cdot cm$). The word "good thermal conduction" means a thermal conductivity of not less than 18 (W/m·k), more efficiently, a thermal conductivity of not less than 60 (W/m·k), and most preferably, a thermal conductivity of not less than 140 (W/m·k).

In order to fabricate the ceramic substrates 10a, 10b and 10c, a ceramic material is filled in a predetermined mold, is formed by the hot press molding, and then is sintered. The similar material and fabrication process to those of the ceramic substrates 10a, 10b, and 10c are used to obtain the other ceramic substrates described below. Note that the ceramic substrate 10 has a structure of multiple layers, however, the ceramic substrate 10 may have a structure of a single layer.

In the middle of the ceramic substrate 10b, a taper-shaped first through-hole is formed so as to penetrate the ceramic substrate 10b in the thickness direction. The diameter of the first through-hole (the width in a surface direction of the ceramic substrate 10) is narrower toward the substrate 10a from the substrate 10c. A wall of the first through-hole and a part of the surface of the ceramic substrate 10a constitute the foregoing second concave section 10d, the part of the surface being a bottom surface of the second concave section 10d. Since the frustum of circular cone shape is easily formed and has high light-reflectivity as described below, the second concave section 10d preferably has a shape of frustum of circular cone—for example, conical-cone-shaped and cup-shaped—which allows the light to easily reflect toward the light exit aperture of the concave section.

In the middle of the ceramic substrate 10c, a taper-shaped second through-hole is formed so as to penetrate the ceramic substrate 10c in the thickness direction. The diameter of the through-hole is broader toward the substrate 10c from the substrate 10b. A wall of the first through-hole and a part of the surface of the ceramic substrate 10b constitute the foregoing first concave section 10e, the part of the surface being a bottom surface of the first concave section 10e. Therefore, the second concave section is further formed at the bottom surface of the first concave section 10e.

It is preferable that the axes of symmetry of the first concave 10e and the second concave 10d are positioned so as to be coaxial. The axes of symmetry are in the thickness direction of the ceramic substrate 10b and 10c respectively. It is also preferable that the first concave section 10e has a shape of frustum of pyramid. This is because wiring patterns 11a are easily provided and a wiring process is also easily carried out.

The wiring patterns 11a are provided to supply electricity to the light-emitting devices 3, 8, and 9 on a peripheral surface of the ceramic substrate 10b, the peripheral surface being the bottom surface of the first concave section 10e. Each of the wiring patterns 11a extends to an area where the wiring pattern 11a exposes on the bottom surface of the first concave section 10e from a peripheral edge of the ceramic substrate 10b. Note that the wiring patterns 11a are formed not to reach the aperture section of the second concave section 10d. In other words, the wiring pattern 11a can extend up to such an area as not to reach the aperture section of the second concave section 10d.

Terminal patterns 11b, which are used for external connecting, are electrically connected to respective corresponding wiring patterns 11a. The terminal patterns 11b are provided to extend (i) to the upper surface (the surface having the light exit aperture) of the ceramic substrate 10c, (ii) to an end face of the ceramic 10c that is connected to the upper surface, and (iii) to an end face of the ceramic substrate 10b that is connected to the end face of the ceramic 10c.

With this arrangement, via the terminal patterns 11b and the wiring patterns 11a, the power source can be supplied to the light-emitting devices 3, 8, and 9, respectively. Further, it is possible to carry out the external connecting via the terminal patterns 11b provided on the upper surface of the ceramic substrate 10c. On this account, even in cases where a radiator (heat discharging member) is provided on a side of the ceramic substrate 10a, i.e., on a back opposite surface side of the light exit aperture, it is possible to improve the radiation efficiency of the radiator without a conventional connecting substrate between the radiator and the ceramic substrate 10a unlike the conventional arrangement shown in FIG. 39 and FIG. 40.

Furthermore, in the light-emitting apparatus package, the metalized (metal) layer 12 (i) of which the heat conduction is better (larger) than that of the respective ceramic substrates 10a, 10b, and 10c is provided so as to partially constitute the second concave section 10d, and (ii) on which the respective light-emitting devices 3, 8, and 9 are provided. The metalized layer 12 can be made of any material having high light reflectivity and good heat-conductance, and is exemplified by such as a silver (Ag) plating.

The metalized layer 12 preferably has such a light reflectivity that reflects 50%—more preferably 70%—of the incident light. In the present embodiments, it is preferable that the metalized layer 12 is provided on substantially the entire surface of the second concave section 10d.

The metalized layer 12 may be provided in such a hem manner, in such a flange manner, or in such a radial manner as to extend outward on an inner surface of the first concave section 10e, provided that the metalized layer 12 is spaced away from the respective wiring patterns 11a and is maintained to be electrically insulated from the wiring patterns 11a. Note that the other metalized layers (later described) may be similar to the metalized layer 12 when a material or a manufacturing method thereof is not specified.

Figure 5:
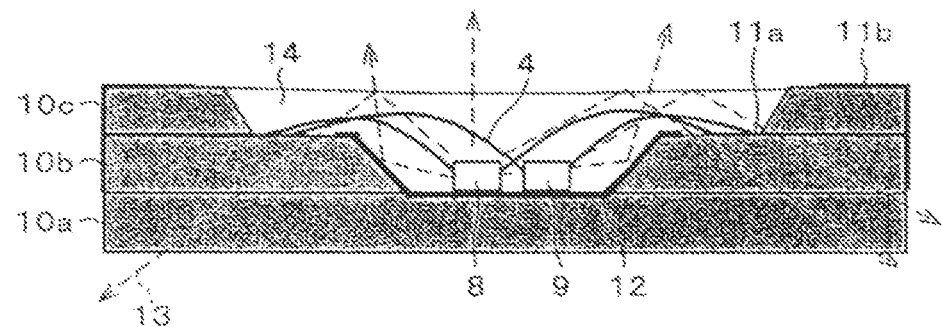
FIG. 5 is a cross sectional view illustrating respective optical paths of the light emitted from the light-emitting devices.
Figure 6:
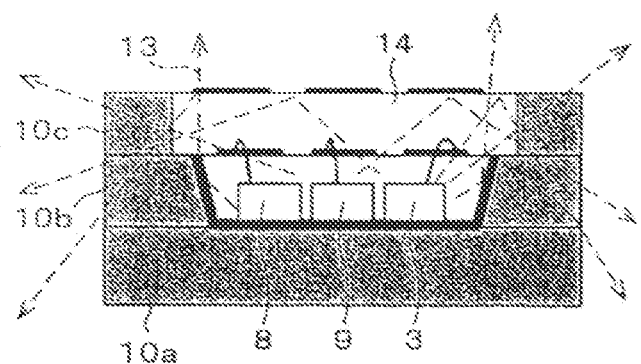
FIG. 6 is another cross sectional view illustrating optical paths of the light emitted from the light-emitting devices.

In a light-emitting apparatus of the present invention in which the foregoing light-emitting apparatus package is used, as shown in the FIG. 5 and FIG. 6, the light-emitting devices 3, 8, and 9 are firmly adhered by a conductive adhesive agent (not shown) to the metalized layer 12 of the second concave section 10d. The conductive adhesive agent has good heat-conduction and good electric conduction.

Here, the light-emitting devices 3, 8, and 9 are provided so that the respective light irradiated from the light-emitting devices 3, 8, and 9 are directed to the ceramic substrate 10b from the substrate 10a along the thickness direction of the substrates 10a, 10b, 10c, i.e., to the light exit aperture of the light-emitting apparatus package. Namely, the respective lights are directed toward an opening from which the respective lights are emitted out.

Furthermore, in the present embodiment, power supplying electrodes for the light-emitting devices 3, 8 and 9 are provided on a surface other than the surface on which the light-emitting devices 3, 8 and 9 are fixed. Preferably, the electrodes for the light-emitting devices 3, 8, and 9 are provided on a same surface as a light-emitting surface from which the respective lights are emitted out.

In the light-emitting apparatus, each electrode for the light-emitting devices 3, 8 and 9 is connected to its corresponding wiring pattern 11a via a gold (Au) wire 4. Instead of gold, silver or copper or aluminum or metal alloying of gold and any one of the above-mentioned metals may be used.

Therefore, the light-emitting devices 3, 8 and 9 are provided on a surface that is different from the surface where the wiring patterns 11a are provided. In other words, the light-emitting devices 8 and 9 are provided on the bottom surface of the second concave section 10d, the bottom surface being provided under the surface on which the wiring patterns 11a are formed.

Furthermore, in the second concave section 10d and in the first concave section 10a, a transparent resin section 14, having excellent translucency and made of such as an acrylic resin, is filled such that the top surface of the transparent resin section 14 and the top surface (upper surface) of the ceramic substrate 10c are coincident with each other.

According to the light-emitting apparatus includes (i) the ceramic substrates 10a, 10b, and 10c having good heat-conduction, —particularly the ceramic substrates 10a and 10b— and (ii) the metalized layer 12. On this account, even when the light-emitting devices 3, 8, and 9 generate the heat during their emitting, the heat thus generated can be radiated quickly via the metalized layer 12 and the ceramic substrates 10a and 10b, respectively. This ensures to suppress the instability of the light-emitting devices 3, 8, and 9 caused by the temperature-increase.

Further, the metalized layer 12 has the light reflectivity. On this account, even when (i) the ceramic substrates 10a and 10b are so thin that light passes through the ceramic substrates 10a and 10b, and (ii) the respective light irradiated from the part of the light-emitting devices 3, 8, and 9 is reflected at the surface of the transparent resin section 14, and is directed to the ceramic substrates 10a and 10b as the respective stray light, the metalized layer 12 reflects the respective stray light in the direction along with the light radiation of the light-emitting devices 3, 8, and 9. This ensures to improve the utilization efficiency of the light.

[Second Embodiment]

As shown in FIG. 5, the respective light 13 irradiated from the light-emitting devices 3, 8, and 9 may be reflected at the top surface of the transparent resin section 14 which seals the light-emitting devices 3, 8, 9 and the Au wires 4. The light thus reflected becomes the stray light directing to unintended direct ions.

Figure 7:
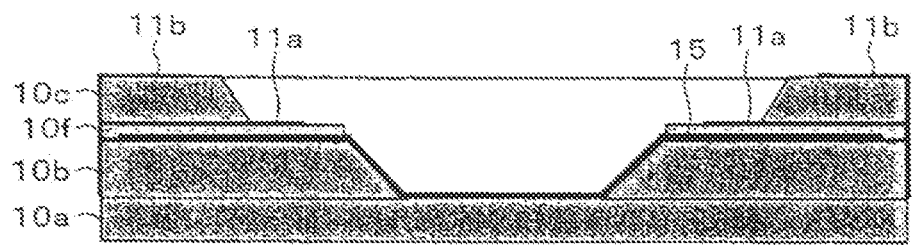
FIG. 7 is a cross section view illustrating a light-emitting apparatus package in accordance with Second Embodiment of the present invention.
Figure 8:
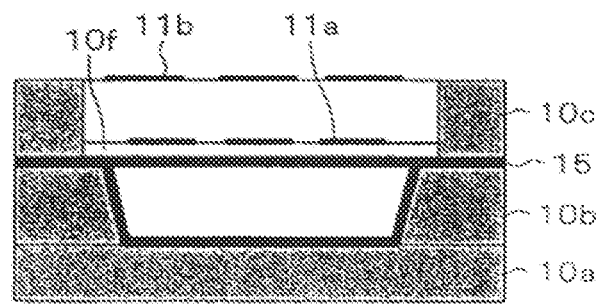
FIG. 8 is another cross sectional view illustrating a light-emitting apparatus package of the Second Embodiment of the present invention.

In order to prevent the stray light, in the second embodiment of the present invention, as shown in FIG. 7 and FIG. 8, another metalized layer 15 having light reflectivity and heat-conduction is provided in addition to the metalized layer 12, under the layer where the wiring patterns 11a, to which the Au wires 4 are respectively connected, are provided. In other words, the metalized layer 15 is provided so as to extend from the end of the metalized layer 12 to such an area as to face the wiring patterns 11a in the thickness direction.

The metalized layer 15 may be arranged so as to reach a peripheral edge part of the substrate 10b other than a peripheral edge part of the substrate 10b on which the respective wiring patterns 11a expose, and so as to expose at the above peripheral edge part. Alternatively, the metalized layer 15 may be arranged so as to extend to and reach a wall of the ceramic substrate 10c other than a wall of the ceramic substrate 10c which makes contact with the respective wiring patterns 11a.

In order to maintain electric insulation in the metalized layer 15 against the wiring pattern 11a, a ceramic substrate 10f is provided as an insulating layer between the metalized layer 15 and the wiring patterns 11a.

In First and Second Embodiments, the terminal patterns 11b are provided so as to bridge the end face of the ceramic substrate 10b and the outer peripheral part of the ceramic substrate 10c. However, as shown in the FIG. 9 and FIG. 10, instead of the terminal patterns 11b, terminal patterns 16 may be provided so as to bridge between the end faces of the ceramic substrates 10f and 10b and the outer peripheral part of the ceramic substrate 10a.

Figure 11:
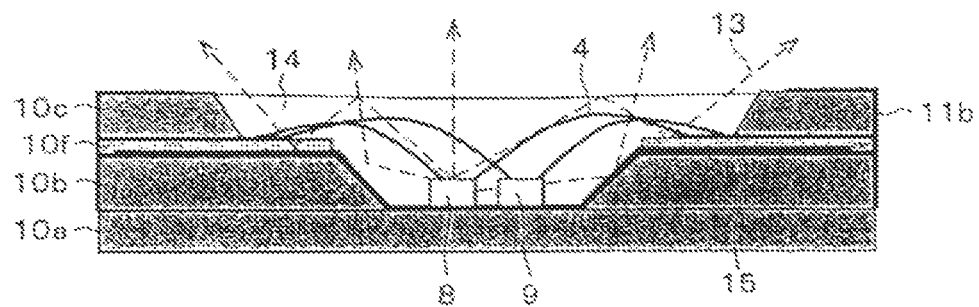
FIG. 11 is a cross sectional view illustrating optical paths of the light emitted from respective light-emitting devices of a light-emitting apparatus in accordance with the Second Embodiment.
Figure 12:
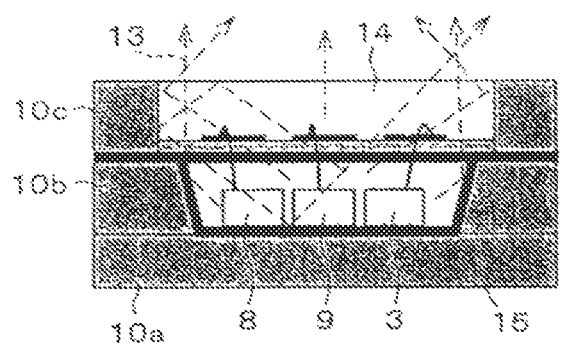
FIG. 12 is another cross sectional view illustrating optical paths of the light emitted from respective light-emitting devices of a light-emitting apparatus in accordance with the Second Embodiment.

In Second Embodiment, as shown in FIG. 11 and FIG. 12, the light 13 that has been reflected at the surface of the transparent resin section 14 directs toward and into the ceramic substrates 10a and 10b is reflected again by the metalized layer 15, which also serves as a reflective layer, so as to direct to the light exit aperture. On this account, it is possible to further improve the utilization efficiency of the light.

Figure 13:
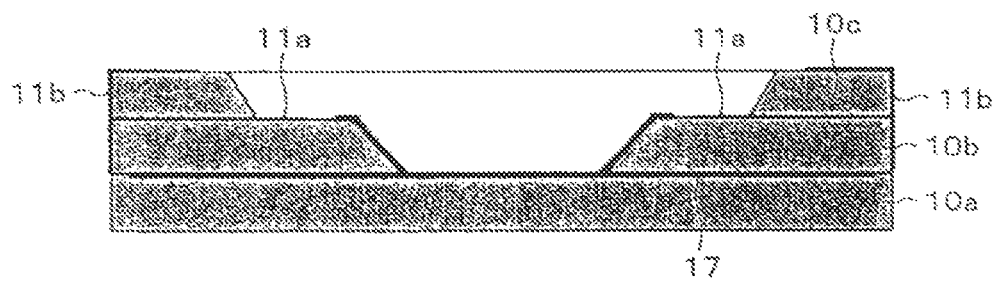
FIG. 13 is a cross sectional view illustrating another modified example in accordance with the Second Embodiment.
Figure 14:
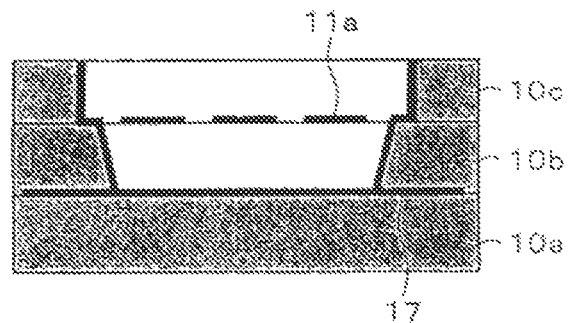
FIG. 14 is another cross section view illustrating the modified example of the Second Embodiment.

FIG. 13 and FIG. 14 shows a modified example of the Second Embodiment which is characterized in that the metalized layer is provided so as to extend to such an area as to face the wiring patterns 11a in the thickness direction. According to the modified example, a metalized layer 17 is provided so as to extend between the ceramic substrates 10a and 10b. The metalized layer 17 is provided on the surface where the light-emitting devices 3, 8, and 9 are respectively provided. In the arrangement, the metalized layer 17 serves as a light-reflective layer and a heat-conduction layer.

Figure 9:
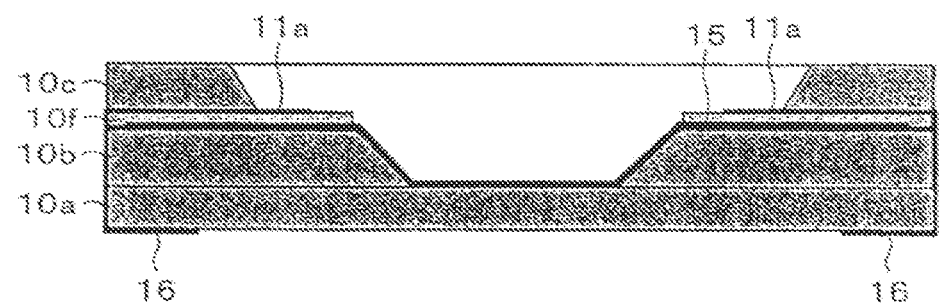
FIG. 9 is a cross sectional view illustrating a modified example of the Second Embodiment of the present invention.
Figure 10:
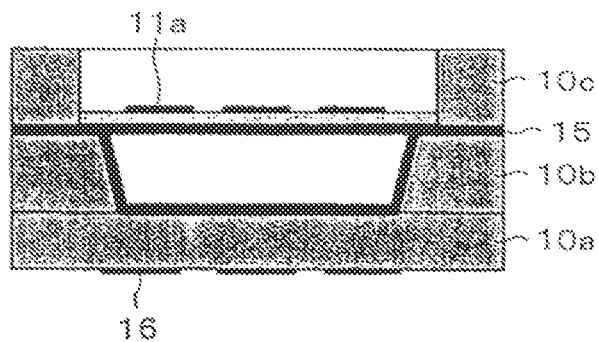
FIG. 10 is another cross sectional view illustrating a modified example in accordance with the Second Embodiment of the present invention.

In this modified example, the light may be attenuated to some extent because the passing distance in the ceramic substrates between the light-reflective layer and light exit aperture becomes longer than the arrangement shown in FIG. 9. However, the number of the layers used in the modified example is less than that in the arrangement shown in FIG. 9. Therefore, the modified embodiment is more cost-effective.

[Third Embodiment]

Figure 15:
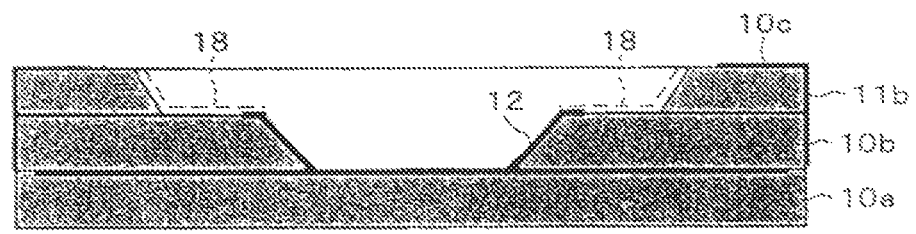
FIG. 15 is a cross sectional view illustrating a light-emitting apparatus package in accordance with Third Embodiment of the present invention.
Figure 16:
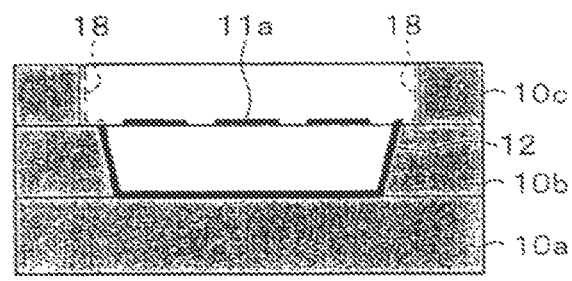
FIG. 16 is another cross sectional view illustrating the Third Embodiment.

In Third Embodiment, a light-emitting apparatus package in accordance with the present invention, as shown in FIG. 15 and FIG. 16, in addition to the arrangement of the First Embodiment, a reflective section 18, which reflects the incident light, is formed by printing on an area other than the area where the wiring patterns 11a are provided on the internal surface of the first concave section 10e on which Au wires are provided.

In the Third Embodiment, because the reflective section 18 reflects the incident light to the area other than the area where the wiring patterns 11a are provided, it is possible to suppress the light directing to an area other than the light exit aperture. This ensures to improve the utilization efficiency of the light. The Third Embodiment may be combined with the First Embodiment, the Second Embodiment or other embodiments described below. This ensures to improve the utilization efficiency of the light.

[Fourth Embodiment]

Figure 17:
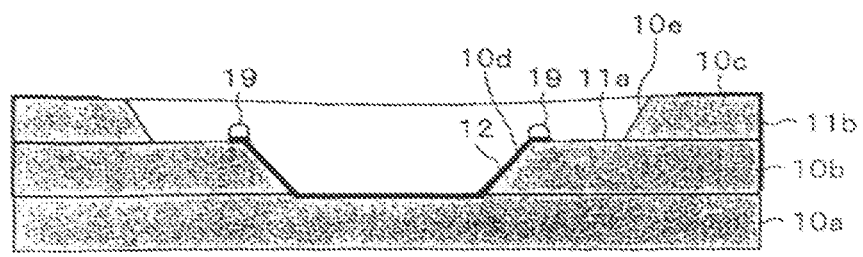
FIG. 17 is a cross sectional view illustrating a light-emitting apparatus package in accordance with Fourth Embodiment of the present invention.
Figure 18:
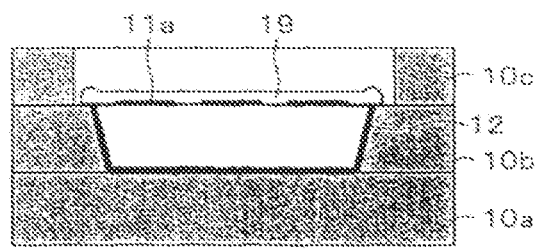
FIG. 18 is another cross sectional view illustrating the Fourth Embodiment.

In Fourth Embodiment, a light-emitting apparatus package in accordance with the present invention, as shown in FIG. 17 and FIG. 18, in addition to the arrangement of the First Embodiment, a dam section 19 is provided by printing in a protruding manner on the first concave section 10e, where the Au wires are provided, in the thickness direction of the ceramic substrate 10b so as to surround the periphery of the opening of the second concave section 10d. The dam section 19 is provided for preventing a resin from leaking into unintended areas when the resin is provided on the flat area of the surface of the ceramic substrate 10b. The dam section 19 serves as effective as a silicon dam.

Figure 19:
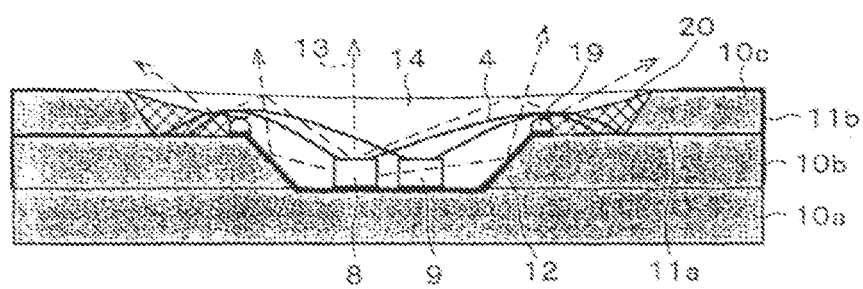
FIG. 19 is a cross sectional view illustrating optical paths of the light emitted from respective light-emitting devices in accordance with the Fourth Embodiment.
Figure 20:
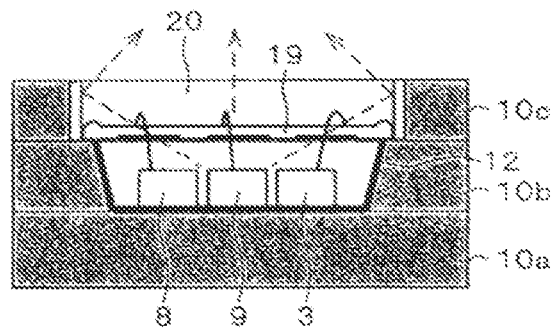
FIG. 20 is another cross sectional view illustrating optical paths of the light emitted from respective light-emitting devices in accordance with the Fourth Embodiment.
Figure 21:
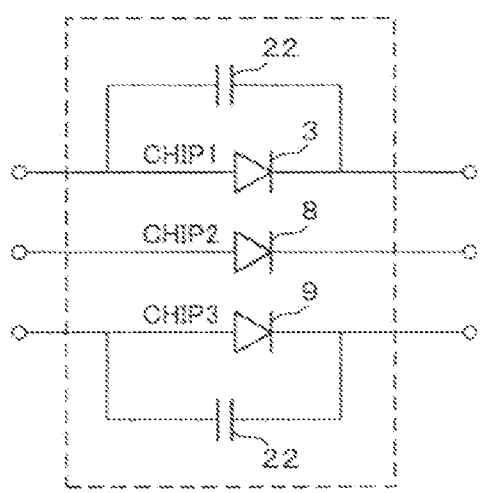
FIG. 21 is a circuit diagram showing light-emitting devices and capacitance elements in accordance with Fifth Embodiment of the present invention.

In a light-emitting apparatus which adopts the light-emitting apparatus package of the Fourth Embodiment, as shown in FIG. 19 and FIG. 20, (i) the light-emitting devices 3, 8, and 9 are provided, (ii) the electrodes for the light-emitting devices 3, 8, and 9 are connected to the wiring patterns 11a, respectively, via Au wires 4, and then (iii), in the first concave section 10e, a light-reflective member such as a white resin 20 is molded outside the dam section 19, i.e., outside the area where the light-emitting devices 3, 8, and 9 are provided.

In this case, the white resin 20 is preferably provided (i) on the surface where the wiring patterns 11a are provided and (ii) on the side surface of the first concave section 10e. Around the area where the light-emitting devices 3, 8 and 9, the transparent resin section 14 is filled for the sealing.

On this account, in the Fourth Embodiment, because the white resin 20 is provided correctly and stably under the favor of the dam section 19, it is possible to suppress the light directing to an area other than the light exit aperture. This ensures to improve the utilization efficiency of the light. The Fourth Embodiment may be combined with the First Embodiment, the Second Embodiment, the Third Embodiment, or other embodiments described below. This ensures to improve the utilization efficiency of the light.

[Fifth Embodiment]

Figure 22:
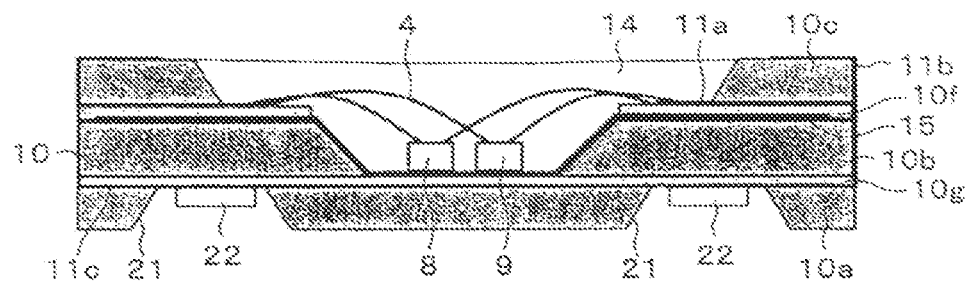
FIG. 22 is a cross sectional view illustrating the light-emitting apparatus of the Fifth Embodiment.
Figure 23:
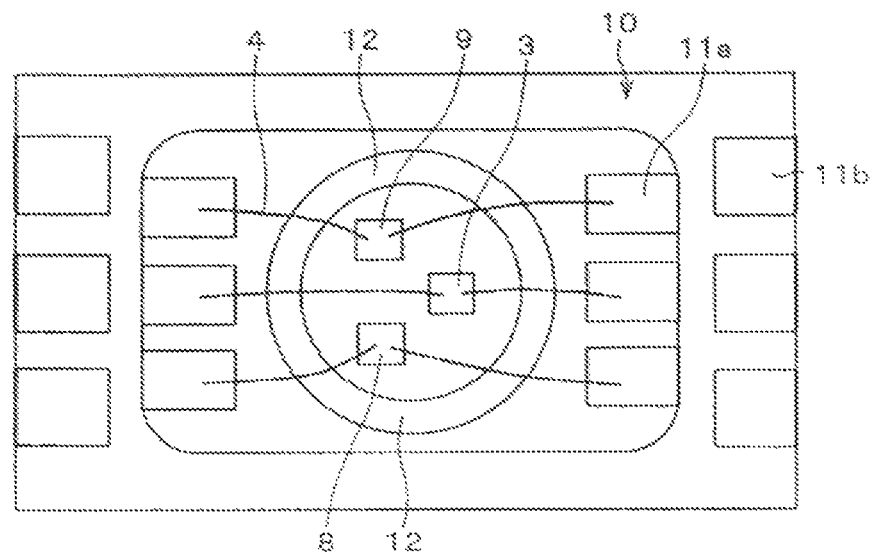
FIG. 23 is a plane view illustrating the light-emitting apparatus.
Figure 24:
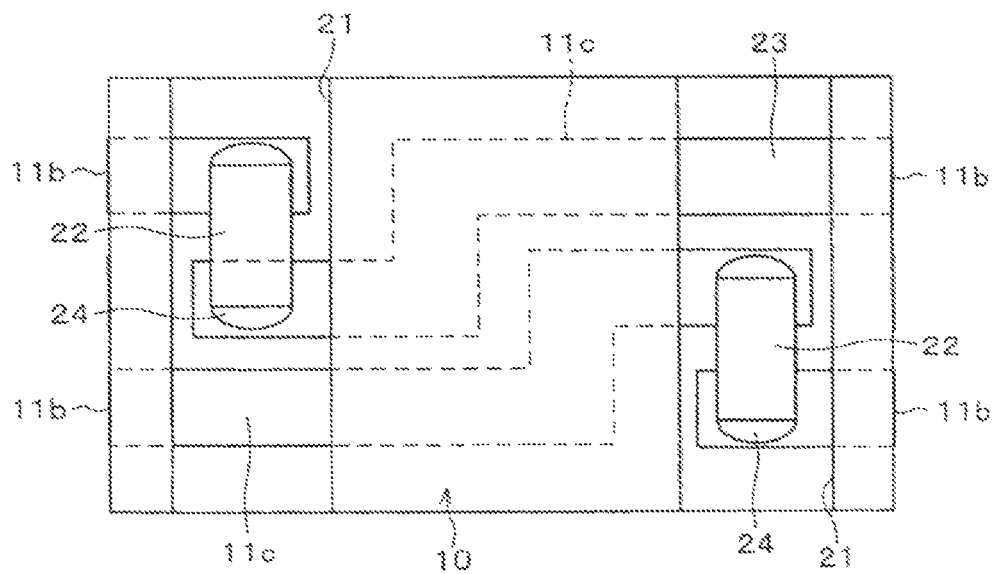
FIG. 24 is a rear view illustrating the light-emitting apparatus.
Figure 25:
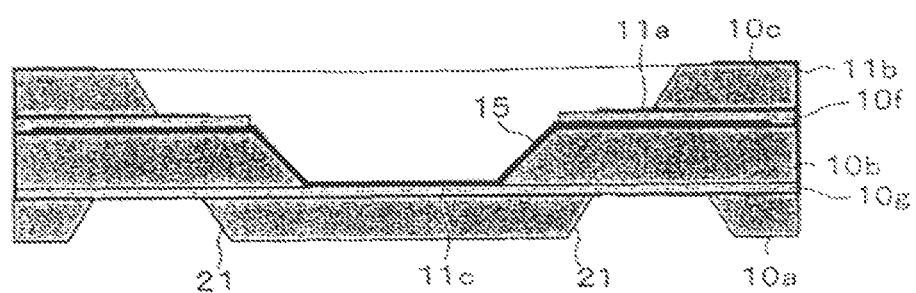
FIG. 25 is a cross sectional view illustrating a light-emitting apparatus package for use in the light-emitting apparatus.
Figure 26:
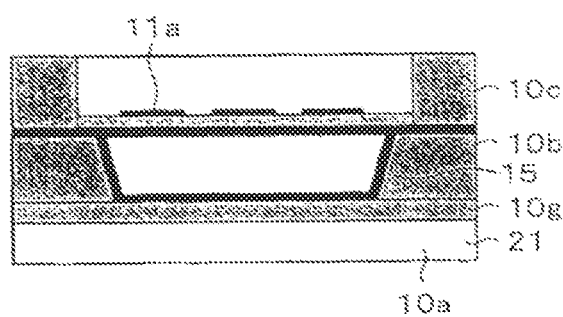
FIG. 26 is another cross sectional view illustrating a light-emitting apparatus package for use in the light-emitting apparatus.

The following description deals with a light-emitting apparatus package having an additional function as Fifth Embodiment of the present invention. Some light-emitting devices have static withstand voltage that is not high. When such light-emitting devices are used, capacitor elements 22 such as ceramic capacitors may be additionally connected in parallel to the light-emitting devices 3, 8 and 9 in order to stabilize the function of the light-emitting devices. The capacitor elements 22 serve as protective devices, respectively. The light-emitting apparatus which adopts the light-emitting apparatus package is shown in FIG. 22 through FIG. 24.

In the light-emitting apparatus package, the ceramic substrates of the Second Embodiment shown in FIG. 7 are used as its basis. As shown in FIG. 22 and FIG. 24, an area where capacitor elements 22 are provided is on a side of the area where the substrate 10a is provided, the side being opposite to the surface where the light-emitting devices are provided. Note that, in Fifth Embodiments, explanations about members having the same functions as the members shown in the First through Fourth Embodiments are omitted here. However, the same reference numerals are put for the members in the figures.

Specifically, an electrically insulated ceramic substrate 10g is provided between the ceramic substrate 10a and the ceramic substrate 10b. The ceramic substrate 10g is thinner than each of the ceramic substrates 10a and 10b. Also third through-hole(s) whose number is coincident with the number of the capacitor elements 22 are provided in the direction of thickness of the ceramic substrate 10a. Accordingly, in the light-emitting apparatus package, the ceramic substrate 10g and the third through-hole(s) form a third concave section 21. The third concave section 21 is the area where the capacitor elements 22 are mounted.

Between the ceramic substrate 10g and the ceramic substrate 10a, wiring patterns 11c are formed for connecting the capacitor elements 22. The wiring patterns 11c are connected to the terminal patterns 11b respectively corresponding to the light-emitting devices 3, 8 and 9 which are connected in parallel to the capacitor elements 22.

In the light-emitting apparatus which adopts such a light-emitting apparatus package, as shown in FIG. 22 through FIG. 24, within the third concave sections 21, the capacitor elements 22 are electrically connected and fixed to the respective wiring patterns 11c with the use of a conductive adhesive agent 24.

Thus, because the light-emitting apparatus includes the wiring patterns 11c, and the capacitor elements 22 within the third concave sections 21, the function of the light-emitting devices are stabilized without enlarging the size of the light-emitting apparatus.

Of course, when there is enough space for the third concave sections 21, it is no problem to provide the third concave sections 21 on a same surface as the light emitting surface, and to provide the capacitor elements 22 within the third concave sections 21. In the arrangement of Fifth Embodiment, two capacitor elements 22 are provided, however, the present invention is not limited to this, i.e., alternatively, one capacitor element 22 or three capacitor elements 22 can be provided.

[Sixth Embodiment]

In the foregoing embodiments, the electrodes for the light-emitting devices 3, 8, and 9 are electrically connected to the wiring patterns 11a via the two Au wires 4, respectively, while the two electrodes for the respective light-emitting devices 3, 8, and 9 are provided on a single surface. However, needless to say, a similar light-emitting apparatus to the foregoing embodiments can be realized even when the package uses the light-emitting devices having one of the electrodes on the single surface, the other electrode on the opposite surface to the single surface, the electrode on the single surface being connected the wiring patterns 11a via a single Au wire.

Figure 27:
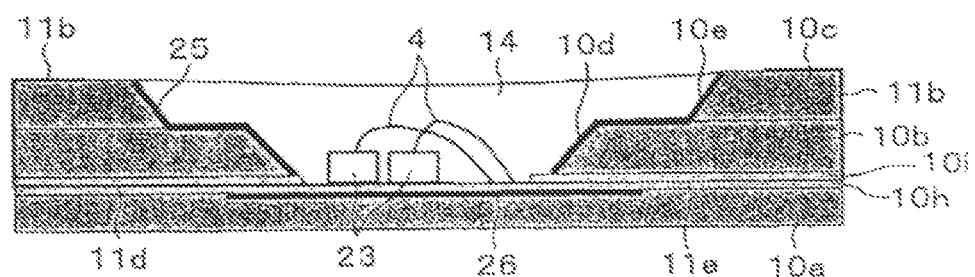
FIG. 27 is a cross sectional view illustrating a light-emitting apparatus in accordance with Sixth Embodiment of the present invention.

Thereinafter, an example of this kind of light-emitting apparatus is explained as Sixth Embodiment. As shown in FIG. 27, in the light-emitting apparatus package of the light-emitting apparatus, wiring patterns 11e to be connected to Au wires 4 are formed on a surface on which light-emitting devices 23 are mounted. In this arrangement, a ceramic substrate 10h (insulating layer) is inserted under the surface where the light-emitting devices 23 are mounted. Under the ceramic substrate 10h, a metalized layer 26 is formed in order to reflect light. Note that, when the light-emitting devices 23 to which the electric connecting is carried out with a single Au wire 4, one light-emitting device needs to be electrically insulated from the other light-emitting device 23. Therefore, the metalized layer 26 is provided, as a light-reflective layer, under the ceramic substrate 10h.

The thickness of the ceramic substrate 10h is preferably as thin as possible, provided that the electrical insulation of the ceramic substrate 10h can be maintained. This allows the metalized layer 26 to be close to the light-emitting devices 23. On this account, it is possible for the ceramic substrate 10h to realize good thermal conduction like the foregoing embodiments.

Furthermore, provided upon the ceramic substrate 10h are (i) wiring patterns 11d for fixing the light-emitting devices 23 while the wiring patterns 11d are connected to the electrodes of the light-emitting devices 23, via a conductive adhesive agent, on the surface where light-emitting devices 23 are mounted, and (ii) wiring patterns 11e which are connected to the Au wires 4 from the light-emitting devices 23, respectively. The wiring patterns 11d and 11e are electrically connected to the corresponding terminal patterns 11d, respectively.

Incidentally, in order to improve the utilization efficiency of the light, it is preferable to provide a metalized layer 25, which has a similar light-reflectivity to the metalized layer 12, on the internal surface of the second concave section 10d and the internal surface of the first concave section 10e.

When the metalized layer 25 is provided, it is preferable that a ceramic 10i is provided by laminating (i) between the metalized layer 25 and the wiring patterns 11d, and (ii) between the metalized layer 25 and the wiring patterns 11e. This is because the electric insulation should be kept between the wiring patterns 11d and 11e.

Preferably, in order to assure the electric insulation, the ceramic substrate 10i is formed along the bottom surface of the second concave section 10d so as to project toward the center of the second concave section 10d.

Figure 28:
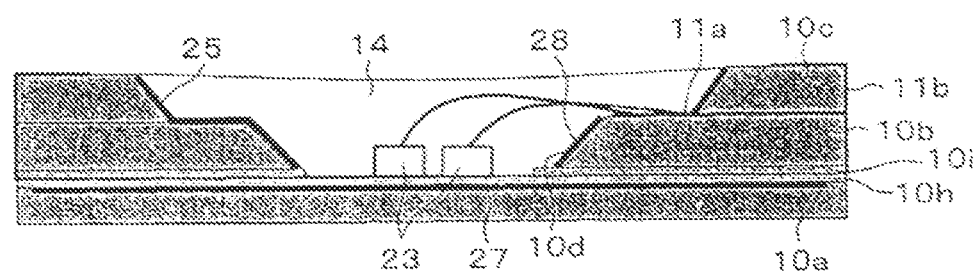
FIG. 28 is a cross sectional view showing a modified example in accordance with the Sixth Embodiment.

As shown in FIG. 28, according to a modified example of the present Sixth Embodiment, wiring patterns 11a, to which respective Au wires 4 are connected, are provided on a surface that is different from a surface where light-emitting devices 23 are provided. A metalized layer 27, which serves as a light-reflective layer, is provided under the surface where the light-emitting devices 23 are provided as in the Sixth Embodiment. However, in the modified example, because the Au wires 4 are connected on the surface that is different from the surface where light-emitting devices 23 are provided, the cup-shaped second concave section 10d can be smaller. This allows the luminous efficiency to be further improved.

Figure 29:
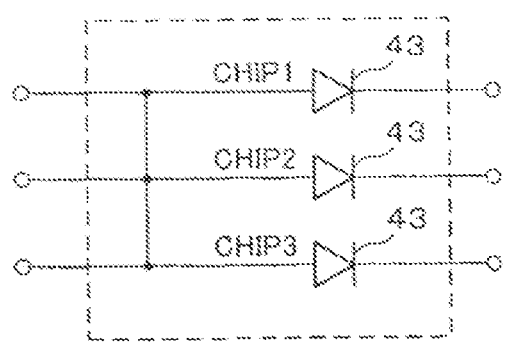
FIG. 29 is a circuitry showing respective light-emitting devices used in the Sixth Embodiment.

In the foregoing embodiments, the light-emitting apparatus has an internal wiring in which a single common line is provided as a whole light-emitting device irrespective of the number of the light-emitting devices. However, as shown in FIG. 29, in a certain light-emitting apparatus including a plurality of light-emitting devices 43, a common-anode connection or a common-cathode connection is made.

Figure 30:
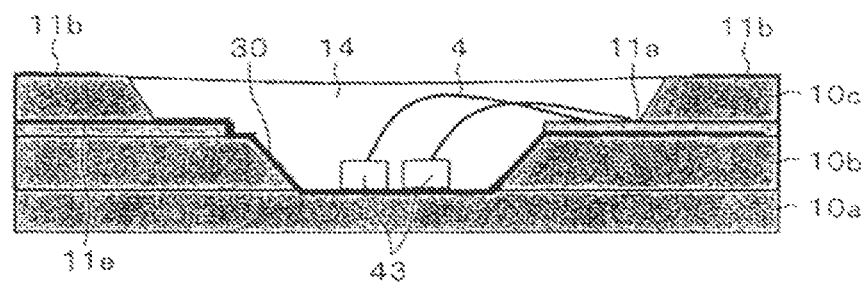
FIG. 30 is a cross sectional view illustrating another modified example in accordance with the Sixth Embodiment.
Figure 31:
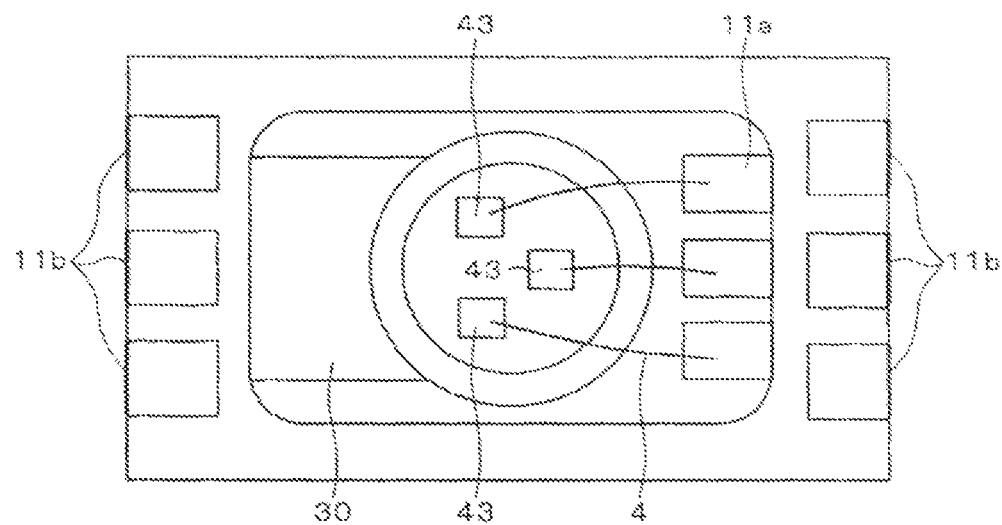
FIG. 31 is a plane view illustration of the modified example of the Sixth Embodiment.

FIG. 30 and FIG. 31 show arrangements in which the light-emitting devices 43 are applied to the present invention. In the figures, the common-anode connection is adopted, but the common-cathode connection may be adopted as well. In this arrangement, the common-cathode connection may be realized by connecting a metalized layer 30, having a cupped-shaped to terminal patterns 11b via wiring patterns 11e.

Figure 32:
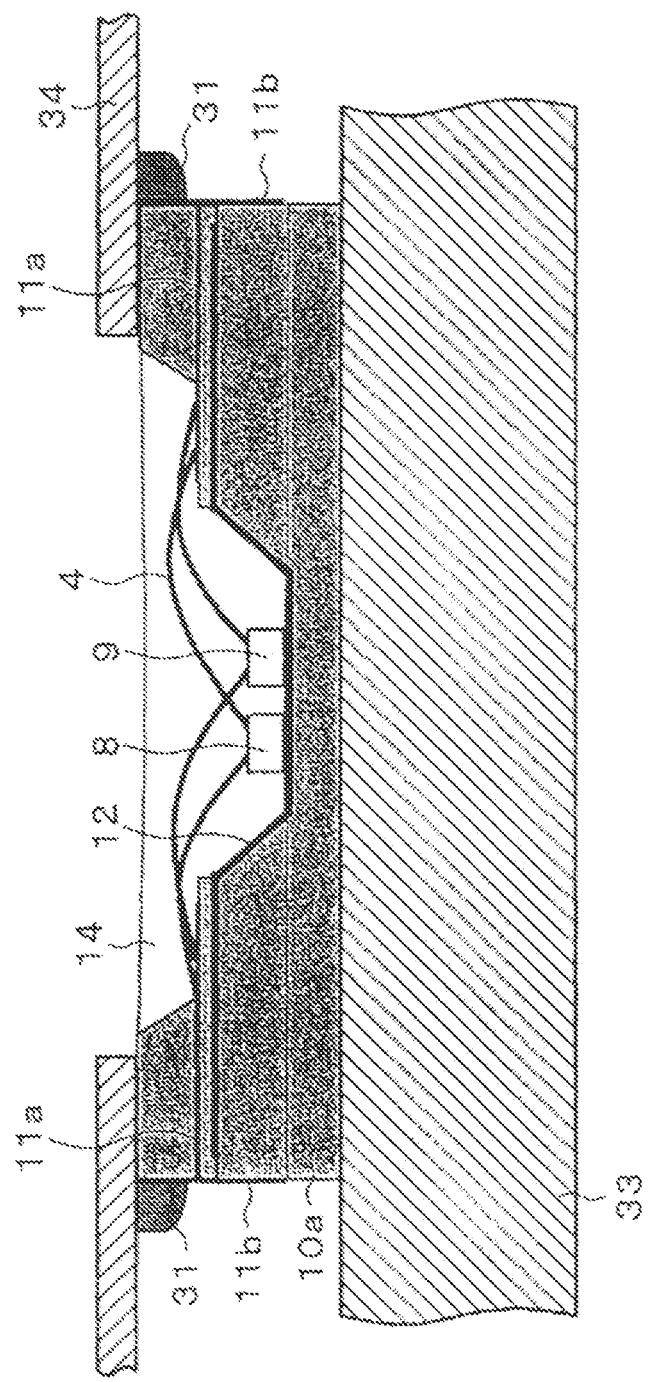
FIG. 32 is a cross sectional view illustrating a main part of an electronic apparatus including a light-emitting apparatus in accordance with the present invention.

Thereinafter, an example of an electric apparatus including the light-emitting device described in the foregoing embodiments is explained with reference to the Second Embodiment. In the electric apparatus, as shown in FIG. 32, by attaching to the light-emitting apparatus package of the Second Embodiment the light-emitting apparatus in which the light-emitting devices 8 and 9 are provided and connected to the electrodes by the Au wires 4 and then the sealing is carried out by the transparent resin section 14 with respect to the first and the second concave sections. In the attaching, (i) an adjustment is carried out such that the light exit aperture of the light-emitting apparatus corresponds to a light-emitting window of a wiring substrate 34, and (ii) the package is electrically connected to the light-emitting device via a conductive adhesive agent 31. A radiator apparatus 33 is further attached to the ceramic substrate 10a.

In the electric apparatus, in order to prevent a short due to contact to the radiator apparatus 33 which is made of a metal such as aluminum, no electric wiring pattern is provided on a surface which makes contact with the radiator apparatus 33. In order to make up for this, the electric connection is made on a side of the light-emitting surface. A wiring substrate 34 onto which the light-emitting apparatus is mounted includes a light-emitting window that is provided so as not to block the emitted light.

According to the present invention, it is possible to improve the radiation property by directly conveying to the radiator apparatus 33 the heat generated by the light-emitting devices 8 and 9 via the metalized layer 12, the ceramic substrate 10a, and the ceramic substrate 10b that respectively have high heat conductivity, without a conventional resin substrate. On this account, it is possible (i) to carry out a large current driving in the electric apparatus, (ii) to realize the improvement in the luminosity, and (iii) to reduce the heat stress on the light-emitting devices 8 and 9 such as LED chip, thereby resulting in that the reliability is improved as well.

Note that, in the light-emitting devices used in the foregoing embodiments, the light-emitting device 3, for example, is designed such that the light-emitting direction is in the thickness direction of the ceramic substrate, i.e., in the direction perpendicular to the surface direction of the ceramic substrate 10. However, the light-emitting direction may be parallel to the surface direction of the ceramic substrate 10.

In this case, a metalized layer which serves as a light-reflective layer should be provided on the internal surface that inclines with respect to the surface direction of the second concave section 10d as shown in FIG. 3. Alternatively, a reflective projection section which reflects the incident light toward the light exit aperture may be separately provided.

Furthermore, when the metalized layer is provided as a light-reflective layer, the inner side surface of the second concave section 10d can have mirror-hollows corresponding to the angle at which light emitted from the light-emitting devices is irradiated. On this account, it is possible to control the light angle so as to suppress the light reflection in a boundary face of such as the transparent resin section 14, thereby further improving the utilization efficiency of the light.

In order to solve the aforementioned problems, a light-emitting apparatus package is so arranged as to include: a ceramic substrate having an electric insulating property and a good heat conductivity; a first concave section recessed in a thickness direction of the ceramic substrate, the first concave section providing a light exist aperture on a top surface of the ceramic substrate; a second concave section, provided in the first concave section, and further recessed in the thickness direction of the ceramic substrate, the second concave section for providing an area for mounting a light-emitting device; a wiring pattern provided in at least one of the first concave section and the second concave section, the wiring pattern for supplying electricity to the light-emitting device; and a metalized layer, provided on an inside-concave-section surface of the ceramic substrate in such a manner that the area for mounting the light-emitting device is sandwiched between the metalized layer and the light exit aperture, and in such a manner that the metalized layer is electrically insulated from the wiring pattern, the metalized layer having a light reflective property.

According to the arrangement, because the first concave section and the second concave section are provided, it is possible to attain downsizing by providing the light-emitting device, the wiring pattern, and the connection therebetween within the first concave section and the second concave section, and to attain that the lighting-emitting device and the wiring pattern are connected surely. Moreover, because the metalized layer is made of a metal, the metalized layer has a better heat conductivity than the ceramic substrate.

Further, according to the arrangement in which the metalized layer constituted of a layer on which silver is gilded or the like layer is provided between the light-emitting device and the surface of the second concave section of the substrate, heat generated when the light-emitting device emits light can be efficiently discharged to outside via the metalized layer and the ceramic substrate. On the account of this, the light-emitting device can stably emit light.

Furthermore, according to the arrangement in which the metalized layer is provided between the light-emitting device and the surface of the second concave section of the substrate, even though light emitted from the light-emitting device is reflected to the opposite direction to the light exit aperture—in other words, the light becomes stray light—, the metalized layer reflects the stray light toward the light exit aperture, thereby improving efficiency in utilizing the light emitted from the light-emitting device.

The light-emitting apparatus package may be so arranged as to further include: an insulating layer under the wiring patterns, the insulating layer being sandwiched between the metalized layer and the wiring patterns.

According to the arrangement in which the insulating layer is sandwiched between the metalized layer and the wiring patterns, it is possible to reflect the stray light with higher efficiency, thereby improving efficiency in utilizing the light.

The light-emitting apparatus package may be preferably arranged such that the metalized layer is exposed within the second concave section.

According to the arrangement, because the metalized layer is exposed in the second concave section, the distance between the light-emitting elements and the metalized layer becomes closer. On the account of this, heat is effectively discharged and light is sufficiently reflected.

In the light-emitting apparatus package, it is preferable that the ceramic substrate contains aluminum nitride. According to the arrangement, in which the ceramic substrate contains aluminum nitride so as to have excellent heat conductivity and molding property, it is possible to product the light-emitting apparatus package more surely and easily.

The light-emitting apparatus package may be so arranged that the metalized layer functions as a part of a wiring pattern. With this arrangement, the metalized layer functions as apart of the wiring pattern, so that the metalized layer is electrically connected with the light-emitting device. Thus, it is possible to position the metalized layer in a vicinity of the light-emitting device, thereby attaining better heat discharge and light reflection.

The light-emitting apparatus package may be so arranged as to further include a printed reflective section provided in that part of the inside-concave-section surface in which the metalized layer and the wiring pattern are not formed, the printed reflective section for reflecting light.

With this arrangement in which the printed reflective section is provided, it becomes possible to attain a higher reflection efficiency of the stray light. Thus, it is possible to further improve the efficiency in utilizing the light.

The light-emitting apparatus package may be so arranged as to further include a dam-for-resin section provided along a periphery of an aperture of the second concave section.

With the arrangement in which a dam-for-resin section is provided along the periphery of the aperture of the second concave section, it is possible to provide a white resin film between the aperture of the second concave section and that of the first concave section, the resin film being light reflective. Therefore, it becomes possible to attain a higher reflection efficiency of the stray light. Thus, it is possible to further improve the efficiency (luminous efficiency) in utilizing the light.

The light-emitting apparatus package may be so arranged as to further include a third concave section on a bottom surface of the ceramic substrate, the third concave section for mounting a chip component (such as a capacitor and the like) for stabilizing operation of the light-emitting device.

With the arrangement in which the third concave section is provided, the size of the light-emitting apparatus package does not become bigger even though the chip components such as condensers are provided within the third concave section so that the light-emitting elements function stably. Thus, it is possible to avoid upsizing.

In order to solve the aforementioned problem, a lighting apparatus of the present invention is so arranged as to include a light-emitting device, provided in the second concave section, the light-emitting device having an electrode on that part of the inside-concave-section surface in which no light-emitting device is provided; a wire for electrically connecting the wiring pattern and the electrode of the light-emitting device; and a transparent resin section for sealing the light-emitting device and the wire, the transparent resin having light transmitting property.

According to the arrangement, by using any one of the foregoing light-emitting apparatus packages, the heat generated from the light-emitting elements is radiated efficiently to the outside via the metalized layer and the ceramic substrate. On the account of this, the light-emitting elements can function stably.

Furthermore, in the arrangement, the metalized layer, which is light reflective, is provided in the position opposite to the light exiting aperture. The place for mounting the light-emitting device is positioned between the metalized layer and the light exiting aperture. Even if the light from the light-emitting device strays, on the boundary surface of the transparent resin section, in an opposite direction to the light exiting aperture, the arrangement makes it possible to emit the stray light from the light-exiting aperture by reflecting the stray light by using the metalized layer. Thus, it is possible to further improve the efficiency (luminous efficiency) in utilizing the light.

The lighting apparatus may be so arranged such that the metalized layer functioning as a part of a wiring pattern; a light-emitting device is provided in the second concave section, having an electrode in an area in which the light-emitting device is provided, and an electrode in an area in which no light-emitting device is provided; a conductive adhesive section is provided, the conductive adhesive section being for connecting (a) the electrode in the area in which the light-emitting device is provided, and (b) the metalized layer, and for fixedly holding the light-emitting device on the metalized layer; a wire is provided, the wire being for electrically connecting (a) the wiring pattern and (b) the electrode in the area in which no light emitting pattern is provided; a resin section is provided on that part of an inside-surface of the first concave section which is between a dam-for-resin section and an inner wall surface of the first concave section, the resin section having a light reflecting property; and a transparent resin section is provided, the transparent resin section for sealing the light-emitting device and the wire, the transparent resin having light transmitting property.

The light-emitting apparatus may be so arranged as to include a light-emitting device, provided in the second concave section, having an electrode in an area in which the light-emitting device is provided, and an electrode in an area in which no light-emitting device is provided; a wire for electrically connecting (a) the wiring pattern and (b) the electrode in the area in which no light emitting pattern is provided; a resin section, provided on that part of an inside-surface of the first concave section which is between a dam-for-resin section and an inner wall surface of the first concave section, the resin section having a light reflecting property; a transparent resin section for sealing the light-emitting device and the wire, the transparent resin having light transmitting property.

The light-emitting apparatus may be so arranged as to include a light-emitting device, provided in the second concave section, having two electrodes in an area in which the light-emitting device is provided, and an electrode in an area in which no light-emitting device is provided; a wire for electrically connecting (a) the wiring pattern and (b) the electrodes in the area in which no light emitting pattern is provided; a resin section, provided on that part of an inside-surface of the first concave section which is between a dam-for-resin section and an inner wall surface of the first concave section, the resin section having a light reflecting property; a transparent resin section for sealing the light-emitting device and the wire, the transparent resin having light transmitting property; and a chip component provided within the third concave section.

The following Seventh through Thirteenth Embodiments of the present invention deal with (i) a lighting apparatus (another light-emitting apparatus), (ii) a backlight apparatus in which the lighting apparatus is used, and (iii) a display apparatus in which the backlight apparatus is used with reference to the figures. The following Embodiments deal with (i) an LED lighting apparatus to which the lighting apparatus is applied, (ii) an LED backlight apparatus in which the LED lighting apparatus is used, and (iii) a liquid crystal display (LCD) apparatus in which the LED backlight apparatus is used.

[Seventh Embodiment]

Figure 33:
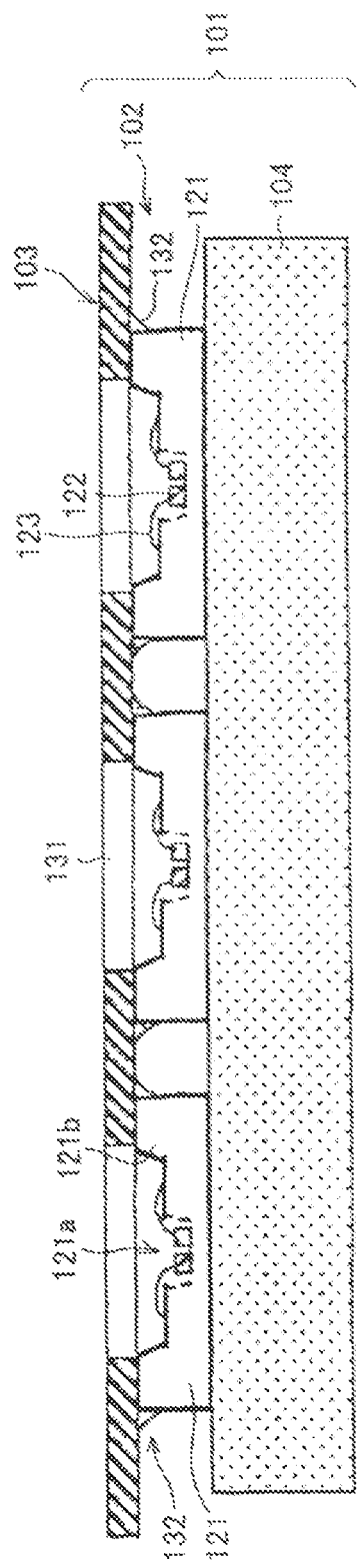
FIG. 33 is a cross sectional view illustrating an arrangement of an LED lighting system in accordance with Seventh Embodiment of the present invention.

FIG. 33 is a cross sectional view showing an arrangement of an LED lighting apparatus in accordance with Seventh Embodiment of the present invention. In FIG. 33, an LED lighting apparatus 101 includes (i) a plurality of LED element substrates 102 (a plurality of substrates each equipped with light-emitting devices) which are provided in a single line or a plurality of lines at predetermined intervals, (ii) a connecting substrate 103 which is provided on the LED element substrate 102, (iii) a radiator device 104 (a radiator member; a heat-discharging member) such as a heat sink provided under a bottom surface of the LED element substrate 102. "On the LED element substrate 102" means an area where an optical path exists in response to the irradiation of the LED.

"Under the bottom surface of the LED element substrate 102" means an area that is opposed to the area where the optical path exists.

The LED element substrate 102 includes (i) a ceramic substrate 121 which serves as a substrate equipped with the light-emitting devices, (ii) LED chips 122, which are light-emitting diode chips that serves as the light-emitting devices (light source), provided on the ceramic substrate 121, and (iii) connecting wires 123 which connects between a predetermined position of wiring patterns (not shown) on the ceramic substrate 121 and electrodes of the LED chips 122. Therefore, the wiring patterns are provided on a surface side of the ceramic substrate 121, i.e., on a side of a surface where the LED chips 122 are mounted.

The ceramic substrate 121 has good heat conduction like the ceramic substrate 10 described in the First Embodiment. The ceramic substrate 121 includes a concave section provided in the center of the surface of the ceramic substrate 121. The concave section includes a deep concave section 121a and a shallow concave section 121b that form a two-stage structure. The deep concave section 121a is provided at substantially a center of the ceramic substrate 121. The shallow concave section 121b is provided around the deep concave section 121a.

The deep concave section 121a includes a single or a plurality of LED chips 122 whose light colors are different from each other. Each LED chip 122 is provided such that its bottom surface makes contact with the bottom surface of the deep concave section 121a. Each LED chip 122 is die-bonded to a wiring pattern (not shown) provided in a predetermined position of the concave section 121a. An electrode of each LED chip 122 is wire-bonded to a wiring pattern (not shown) provided at a predetermined position of the shallow concave section 121b.

In the connecting substrate 103, a window section 131 is provided so as to correspond to the concave section or the LED chip 122 in each ceramic substrate 121, the ceramic substrate 121 being located under the connecting substrate 103. The window section 131 serves as a light transmittance section through which the light from the LED element substrate 102 passes or transmits. Therefore, each window section 131 is a through-hole provided in the thickness direction of the connecting substrate 103. The window section 131 suppresses the broadening of the light emitted from the LED chip 122. In the connecting substrate 103, (i) wiring patterns (not shown) for supplying the current to the LED chip 122 and (ii) wiring patterns (not shown) provided on a top surface of the ceramic substrate 121 are connected to each other by a solder 132 or the like.

The radiator device 104 has an upper surface with which the bottom surface of the ceramic substrates 121 is combined, the bottom surface having no conductive pattern. This allows the heat generated by the LED chip 122 to be conveyed to the radiator device 104, only via an adhesive agent and the ceramic substrate 121. The adhesive agent causes the LED chips 122 to be die-bonded to the ceramic substrate 121.

Therefore, according to the present embodiment, the heat conductance dramatically improves, as compared to the conventional arrangement in which the resin substrate and the connecting substrate are provided between the radiator device 104 and the LED chip 122. This ensures to effectively carry out the radiation.

Figure 34:
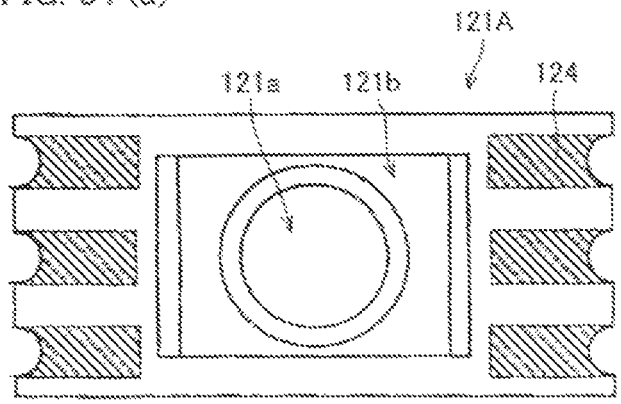
FIG. 34 shows the ceramic substrate in FIG. 33.
Figure 34:
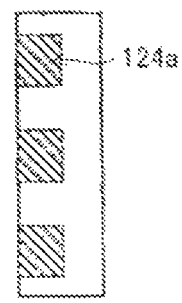
Figure 34:

Thereinafter, described is the detail about members of the LED lighting apparatus of the present Seventh Embodiment. Firstly, the detail about the ceramic substrate 121 (the substrate equipped with the light-emitting device(s)) is explained. FIG. 34 (a) is a plan view showing an arrangement of the ceramic substrate 121 shown in FIG. 33. FIG. 34 (b) is a side view, and FIG. 34(c) is a cross sectional view.

In FIG. 34 (a) through FIG. 34 (c), this ceramic substrate 121A includes (i) a deep concave section 121a whose shape is like a cup and whose plan shape is a circle, the LED 122 being provided in the center of the deep concave section 121a, and (ii) a shallow concave section 121b, provided around the deep concave section 121a, whose plan shape is a rectangle.

The reason why the deep concave section 121a is cup-shaped is to reflect onward or upward the very light emitted from the sides of the LED chip 122 such that the luminosity improves.

The reason why the shallow concave section 121b is provided is (i) to secure an area for the wire-bond of the LED chip 122, and (ii) to reduce the amount of resin when the sealing is carried out with respect to the surrounding area of the shallow concave section 121b. Furthermore, the deep concave section 121a includes wiring patterns for die-bonding the LED chip 122. The shallow concave section 121b includes wiring patterns for the wire-bonding.

Electrode wiring terminals 124, which connect the LED element substrate 102 and the external members (the wiring patterns of the connecting substrate 103)—those of which are described in FIG. 33—, are formed at both ends on the top surface of the ceramic substrate 121 in the longitudinal direction.

The electrode wiring terminals 124 do not extend to a land (not shown) for connecting the LED chip 122, but are provided so as to be independent from the land for the LED chip 122. This ensures to prevent the solder from flowing toward the LED chip 122 when the LED lighting apparatus is soldered with the wiring patterns of the connecting substrate 103. The electrode wiring terminals 124 are electrically connected to the wiring pattern of the connecting substrate 103, for example, via a side surface 124a or the through-hole.

Figure 35:
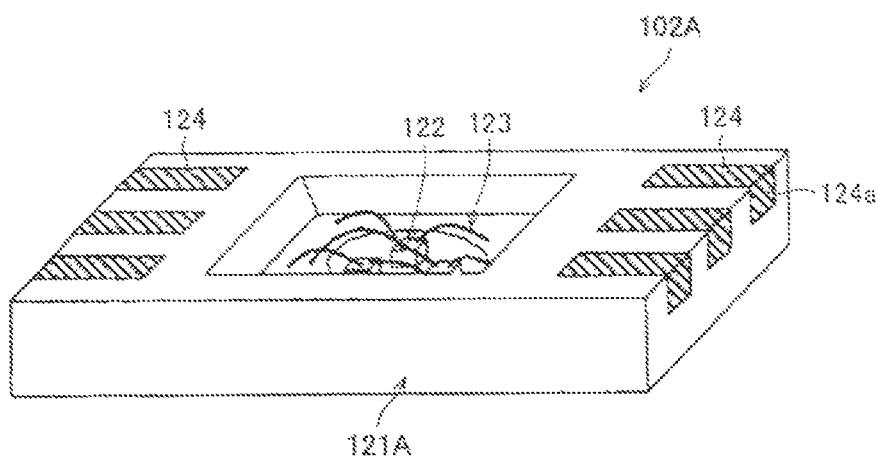
FIG. 35 is a perspective view illustrating a state in which LED chips are provided in the ceramic substrate shown in FIG. 33.

FIG. 35 is a perspective view showing a state in which the LED chip 122 is die-bonded and wire-bonded to the ceramic substrate 121 shown in FIG. 34. In FIG. 35, the LED chip 122 is die-bonded to a predetermined position of the wiring patterns provided in the concave section 121a such that the bottom surface of the LED chip 122 is made contact with and is die-bonded to the bottom of the concave section 121a. The electrode provided on the light-emitting surface of the LED chip 122 is wire-bonded in the predetermined position of the wiring pattern provided within the concave section 121b via the connecting wire 123.

FIG. 36 (a) is a plan view showing another arrangement of the ceramic substrate 121 shown in FIG. 33. FIG. 36 (b) is a side view, and FIG. 36 (c) is a cross sectional view. In FIG. 36(a) through FIG. 36 (c), this ceramic substrate 121B is different from the ceramic substrate 121A shown in FIG. 34 in that electrode wiring terminals 125 are further provided in the concave section 121b.

FIG. 37 (a) is a plan view showing still another arrangement of the ceramic substrate 121 shown in FIG. 33. FIG. 36 (b) is a side view, and FIG. 36 (c) is a cross sectional view. In FIG. 37 (a) through FIG. 37 (c), this ceramic substrate 121C is different from the ceramic substrate 121A shown in FIG. 34 in that a concave section 121c having a single stage structure is provided. The concave section 121c has a bottom surface whose plan shape is an ellipse, and has an upper aperture whose plan shape is a rectangle. In the concave section 121c, land sections 126 are provided separately from the electrode wiring terminals 124 on a top surface of the concave section 121c.

Figure 38:
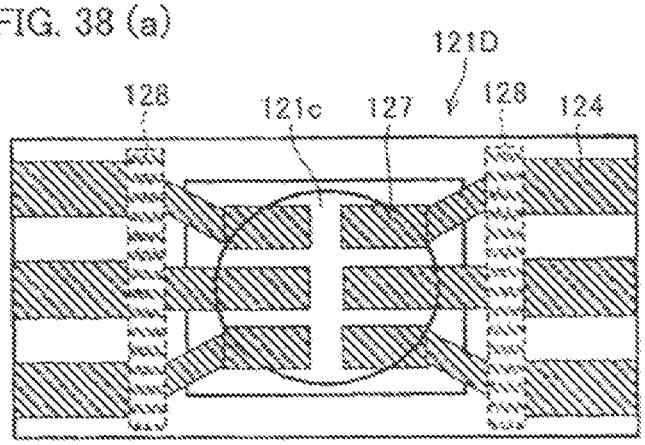
FIGS. 38(a) to 38(c) show the ceramic substrate in FIG. 37.
Figure 38:
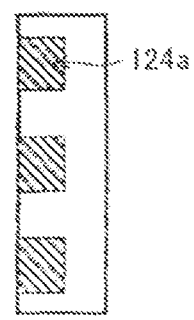
Figure 38:

The FIG. 38 (a) is a plan view showing yet another arrangement of the ceramic substrate 121 shown in FIG. 33. FIG.

38(*b*) is a side view, and FIG. 38(*c*) is a cross sectional view. In FIG. 38 (*a*) through, FIG. 38 (*c*), this ceramic substrate 121D is different from the ceramic substrate 121B shown in FIG. 36. in that a concave section 121*c* having a single stage structure is provided. The concave section 121*c* has a bottom surface whose plan shape is an ellipse, and has an upper aperture whose plan shape is a rectangle. Each of electrode wiring terminals 124 is provided so as to extend from its side part 124*a* to a corresponding land section 127 in the concave section 121*c*. Between the land section 127 of the concave section 121*c* and the electrode wiring terminal 124, an insulating member 128 such as a resist or a silicon dam is provided in order to prevent the solder from flowing into the area where the LED chip 122 is provided.

Figure 39:
FIG. 39 shows arrangements of the connecting substrate in FIG. 33.
Figure 39:

Secondly, detail about the connecting substrate 103 is explained below. FIG. 39 (*a*) is a plan view showing an arrangement of the connecting substrate 103 shown in FIG. 33. FIG. 39 (*b*) is a plan view showing another arrangement of the connecting substrate 103 shown in FIG. 33. In FIG. 39 (*a*) and FIG. 39 (*b*), a connecting substrate 103A and a connecting substrate 103B may be a rigid substrate made of a glass epoxy resin or the like or may be a flexible substrate made of a polyimide or the like.

In the respective connecting substrates 103A and 103B, provided is a plurality of window sections 131*a* and 131*b* which the light emitted from the LED element substrate 102 passes through or transmits, for example, in a line at certain intervals.

The shape of the window section 131 may be set to be appropriate in accordance with a light emitting state of an LED chip. The window section 131 may have a plan shape of such as circle (corresponding to the shape shown in FIG. 39 (*a*)) or rectangle. The position of the window sections 131 may be set as shown in FIG. 39 (*a*) such that circular window sections 131*a* are provided on a center line in a longitudinal direction of the ceramic substrate 103A. Alternatively, the position of the window sections 131 may be set as shown in FIG. 39 (*b*) such that U-shaped window sections 131*b* are provided, in the longitudinal direction of the ceramic substrate 103B, on a line that is away from a center line in a direction perpendicular to the longitudinal direction.

In these connecting substrates 103A and 103B, a plurality of LED element substrates 102 are provided in a line (or in a plurality of lines), and are electrically connected with the electrode wiring terminals 124 via the soldering, respectively.

Figure 40:
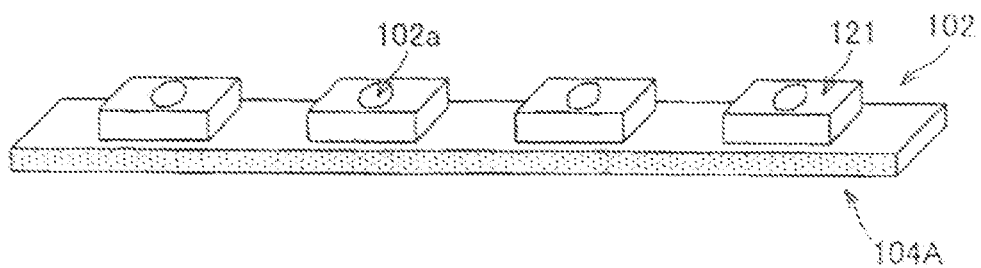
FIG. 40 is a perspective view illustrating a radiator (heat-discharging member) in FIG. 33.

Here, detail about the radiator device 104 is explained below. FIG. 40 is a perspective view illustrating an arrangement of the radiator device shown in FIG. 33. In FIG. 40, the radiator device 104A may include a heatsink, having a good heat-conduction, made of a material such as aluminum. In the ceramic substrate 121, the radiator device 104A is directly combined with a bottom surface of the ceramic substrate 121 (for example, the radiator device 104A is bonded to the ceramic substrate 121 by an adhesive agent having a good heat conduction). The bottom surface of the ceramic substrate 121 is placed on a side that is opposed to an LED element substrate 102*a*. In this case, in the bottom surface of substrate 121 (the surface in which the radiator device 104A is placed), no conductive pattern is provided.

Figure 41:
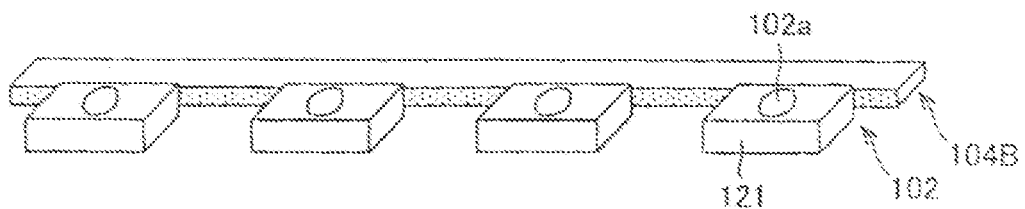
FIG. 41 is a perspective view illustrating another radiator provided differently from FIG. 40.

FIG. 41 is a perspective view showing another arrangement of the radiator device 104 shown in FIG. 33. In FIG. 41, a radiator device 104B (which may be different from the radiator device 104A) is directly combined with each of a side surface (end face) of the ceramic substrate 121 (for example, the radiator device 104B is bonded to the ceramic substrate 121 by an adhesive agent having a good heat conduction). The side surfaces of the respective ceramic substrates 121 correspond to such surfaces that are combined with each other in a line by the radiator 104B. In this case, the side surface includes no conductive pattern. The arrangement shown in FIG. 41 is effective when it is required for an LED lighting apparatus to have a thickness that is thinner than the arrangement shown in FIG. 40.

Note that, in the Seventh Embodiment, the radiator device 104 is combined with the bottom surface or the side surface of the LED element substrate 102 which has the light-emitting devices. The present invention is not limited to this. Alternatively, the radiator device 104 may be combined with both of the bottom surface and the side surface of the LED element substrate 102. This arrangement allows the radiation property to further improve.

Figure 42:
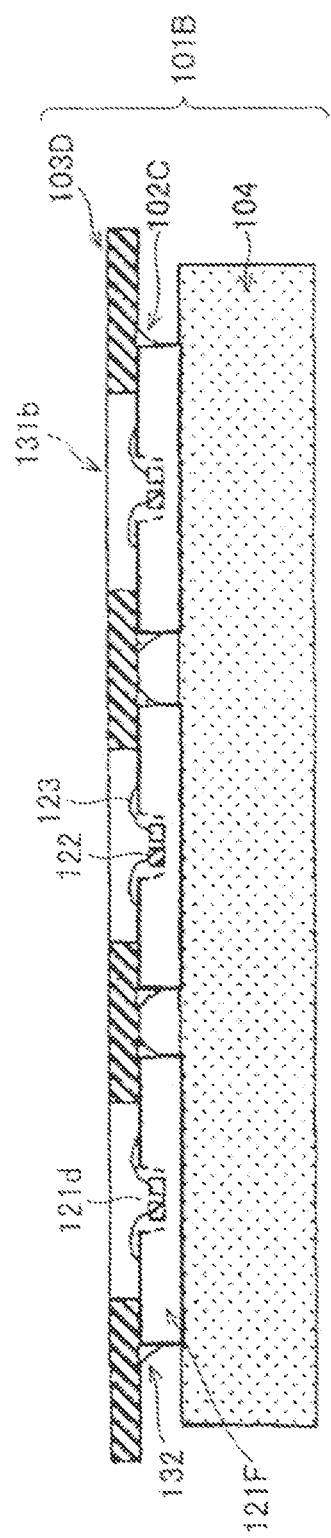
FIG. 42 is a cross sectional view illustrating another arrangement of the LED lighting apparatus of Seventh Embodiment of the present invention.

FIG. 42 is a cross sectional view illustrating another arrangement of an LED lighting apparatus of the Seventh Embodiment in accordance with the present invention. In the example, the LED lighting apparatus has a single concave section. In FIG. 42, an LED lighting apparatus 101B includes a single stage concave section 121*d* at the center of a surface of a ceramic substrate 121F. The deep concave section 121*d* includes a single or a plurality of LED chips 122 whose light colors are different from each other. Each LED chip 122 is provided such that its bottom surface makes contact with a bottom surface of the deep concave section 121*d*. Each LED chip 122 is die-bonded on the predetermined position of a wiring pattern (not shown).

Electrode in the light-emitting side of the light-emitting device formed in the deep concave section 121*d* is connected by a wire 123 to a wiring pattern (not shown), provided around the concave section 121*d* at a predetermined position, thereby constituting an LED element substrate 102C.

At both end parts of the top surface of the LED element substrate 102C (the ceramic substrate 121F), electrode wiring terminals (not shown) are provided. The electrode wiring terminals of the LED element substrate 102C is connected to wiring patterns of a connecting substrate 103D at a predetermined position of by a solder or the like. Underneath the connecting substrate 103D, a plurality of LED element substrates 102C are provided in a line (or in a plurality of lines). In the connecting substrate 103D, provided is a plurality of window sections 131*b*, which the light emitted from the LED element substrate 102C passes through or transmits, so as to respectively correspond to the LED element substrates 102C.

In a bottom surface of the ceramic substrate 121F, no conductive pattern is provided. However, a radiator device 104 such as a heatsink is combined with the bottom surface of the ceramic substrate 121F.

Like the LED lighting apparatus 101 shown in FIG. 33, the LED lighting apparatus 101B allows the heat generated by the LED chip 122 to be conveyed to the radiator device 104, only via an adhesive agent and the ceramic substrate 121F. The adhesive agent die-bonds the LED 122 to the ceramic substrates 121F at its predetermined position. Therefore, according to the present embodiment, the heat conductance dramatically improves, as compared to the conventional arrangement in which the resin substrate and the connecting substrate are provided between the radiator device 104 and the LED chip 122. This ensures to effectively carry out the radiation.

[Eighth Embodiment]

Figure 43:
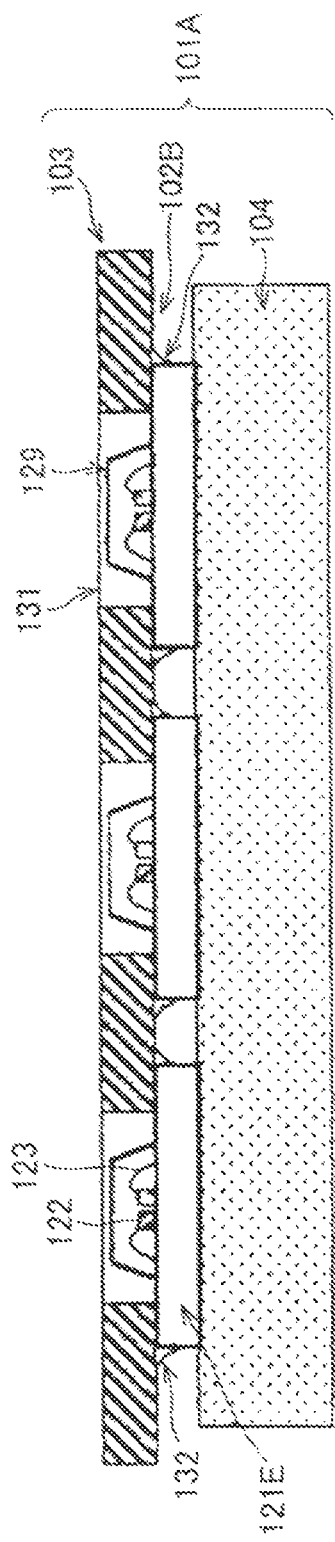
FIG. 43 is a cross sectional view illustrating an arrangement of the LED lighting apparatus of Eighth Embodiment of the present invention.

The Seventh Embodiment deals with the lighting apparatuses 101 and 101B in which, in order to improve both of the radiation efficiency and the efficiency of incident light, (i) the connecting substrate 103, the LED element substrate 102, and the radiator device 104 are provided in this order, (ii) the LED element substrate 102 includes a single stage or two-stage concave section, and (iii) in the concave section, the LED chips 122 are die-bonded to wiring patterns at predetermined positions, respectively. Eighth Embodiment, as shown in FIG. 43, deals with a lighting apparatus 101A. According to the lighting apparatus 101A, an LED element substrate 102 does not include concave sections. The LED element substrate 102 is a flat plate. On the flat surface of the LED element substrate 102, the LED chips 122 are die-bonded at predetermined positions, respectively.

FIG. 43 is a cross sectional view illustrating an arrangement of an LED lighting apparatus of the Eighth Embodiment in accordance with the present invention. In this LED lighting apparatus 101A shown in FIG. 43, in a flat surface (an upper surface) of a ceramic substrate 121E, a single or a plurality of LED chips 122 whose colors are different from each other are provided such that a bottom surface makes contact with a ceramic substrate 121E, the bottom surface being opposed to a surface from which the light irradiated from the LED chip is emitted out. The LED chips are die-bonded to wiring patterns (not shown), at predetermined positions, provided on the upper surface of the ceramic substrate 121E.

An LED element 102B is arranged such that electrodes provided on the side of the light-emitting surface of the LED chips 122 are wire-bonded, by connecting wires 123, to the predetermined positions of wiring patterns (not shown) which are provided in the flat top surface of the ceramic substrate 121E. The LED chips 122 and the connecting wires 123 are molded by a resin 129.

(i) Wiring patterns (not shown) on the ceramic substrate 121E (on a side of the light-emitting surface), and (ii) wiring patterns (not shown) provided on a surface of the connecting substrate 103 are combined with each other at predetermined positions by the solder 132 or the like.

Underneath the connecting substrate 103, a plurality of LED element substrates 102B are provided in a line (or in a plurality of lines). In the connecting substrate 103, a window section 131 is provided so as to correspond to each of the LED element substrates 102B. The window section 131 causes the light from the LED element substrate 102B to pass through or to transmit.

No conductive pattern is provided in a bottom surface of the ceramic substrate 121E (a surface opposed to a surface from which the light from the LED element substrates 102B is gone out). A radiator device 104 is combined with the bottom surface of the ceramic substrate 121E. Like the LED light installation 101 shown in FIG. 33, in the LED light installation 101A, the arrangement allows the heat generated by the LED chip 122 to be conveyed to the radiator device 104, only via an adhesive agent and the ceramic substrates 121E. The adhesive agent causes the LED chips 122 to be die-bonded to the ceramic substrate 121E.

Therefore, according to the present embodiment, the heat conductance dramatically improves, as compared to the conventional arrangement in which the resin substrate and the connecting substrate are provided between the radiator device 104 and the LED chip 122. This ensures to effectively carry out the radiation.

The following description of Ninth Embodiment in accordance with the present invention deals with (i) an LCD backlight module (an LCD backlight apparatus) in which the LED lighting apparatus 101 of the Seventh Embodiment or the LED lighting apparatus 101B of the Seventh Embodiment or the LED lighting apparatus 101A of the Eighth Embodiment is used, and (ii) an LCD module (a LCD display apparatus) in which the LCD backlight module is used.

[Ninth Embodiment]

Figure 44:
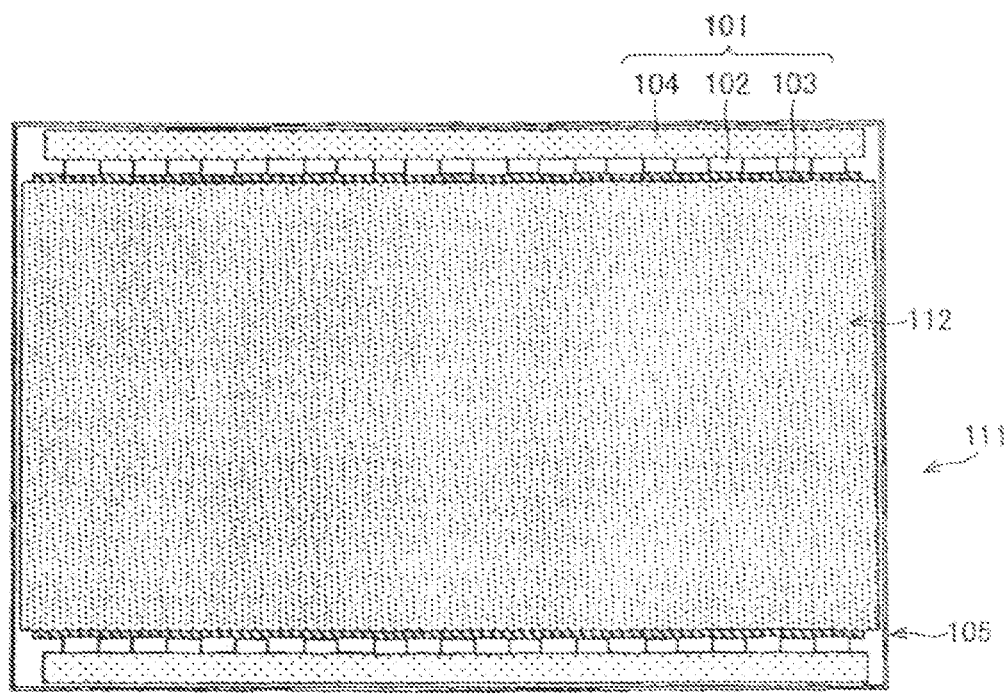
FIG. 44 is a plan view illustrating an LCD backlight module of Ninth Embodiment of the present invention.
Figure 45:
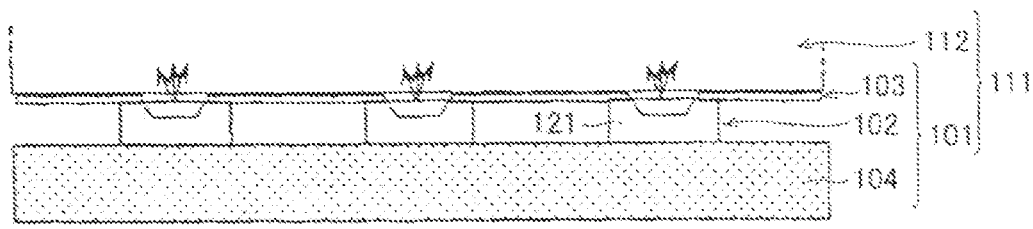
FIG. 45 is a cross sectional view of the backlight module shown in FIG. 44.
Figure 46:
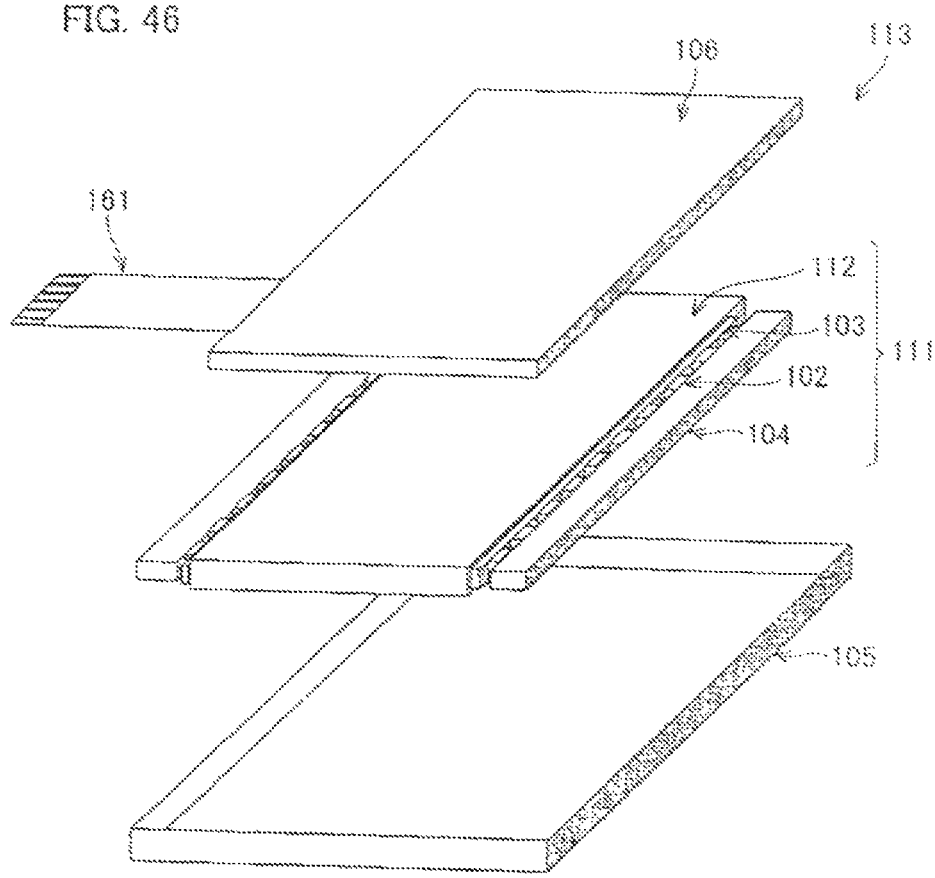
FIG. 46 is an exploded perspective view illustrating the LCD backlight module shown in FIG. 44 and FIG. 45.

FIG. 44 is a plan view illustrating a LCD backlight module in accordance with the Ninth Embodiment, and FIG. 45 is its cross sectional view, and FIG. 46 is an exploded perspective view illustrating an LCD module adopting the LCD backlight module shown in FIG. 44 and FIG. 45.

In FIG. 44 through FIG. 46, an LCD backlight module 111 includes the LED lighting apparatus 101 and a light guide plate 112. The light guide plate 112 (i) is provided for surface radiation, (ii) receives the light emitted from the LED lighting apparatus 101 such that the light travels in the light guide plate 112, and (iii) causes the light to go out from a surface side in a predetermined direction.

The LCD module, served as an LCD display apparatus, includes the LCD backlight module 111, a case 105 which contains the LCD backlight module 111, and an LCD panel 106 for image display. Note that, instead of the LED lighting apparatus 101, the above-mentioned LED lighting apparatus 101A or the LED lighting apparatus 101B may be used.

The light guide plate 112 is arranged such that two end faces, through which the light from the LED lighting apparatus 101 is entered, face side end faces of the light guide plate 112. In this arrangement, it is assumed that the light is entered to the light guide plate 112 via the two end faces. However, the light may be entered to the light guide plate 112 via only one end face. The incident light on the side surface (light incidence side surface) of the light guide plate 112 from the LED lighting apparatus 101 travels in the light guide plate 112, and then emits out from a top surface uniformly.

The LCD backlight module 111 is contained in the case 105 with its bottom surface (a surface opposed to the surface via which the is entered) made contact with the case 105. Above the upper surface from which the light is gone out of the LCD backlight module 111, the LCD panel 106 is provided.

The LCD panel 106 includes a pair of substrates and a liquid crystal (LC) layer provided between the substrates. When a voltage is applied to between the substrates, liquid crystal molecules change their alignment states in the respective pixels that are provided in a matrix manner, thereby carrying out the image display.

The voltage for displaying is supplied from an external connection wiring that is connected to the LCD panel 106. When the light irradiated from the LCD backlight module 111 is entered into the LCD panel 106, the light passes through and is scattered because the liquid crystal molecules differently align. This allows letters and figures that vary depending on the voltage for displaying to be displayed on an LCD screen.

As described above, according to the Seventh Embodiment through the Ninth Embodiment, the radiator device 104 has the upper surface with which the bottom surface of the ceramic substrates 121 is combined. This allows the heat generated by the LED chip 122 to be conveyed to the radiator device 104, only via the adhesive agent and the ceramic substrate 121. Therefore, the LED lighting apparatus can radiate the heat more efficiently than a conventional LED lighting apparatus.

Accordingly, in the LCD backlight apparatus driven by a large current, it is possible to fully carry out the radiation even when the heat value increases, thereby dramatically improving the reliability of the LCD backlight apparatus.

[Tenth Embodiment]

Figure 47:
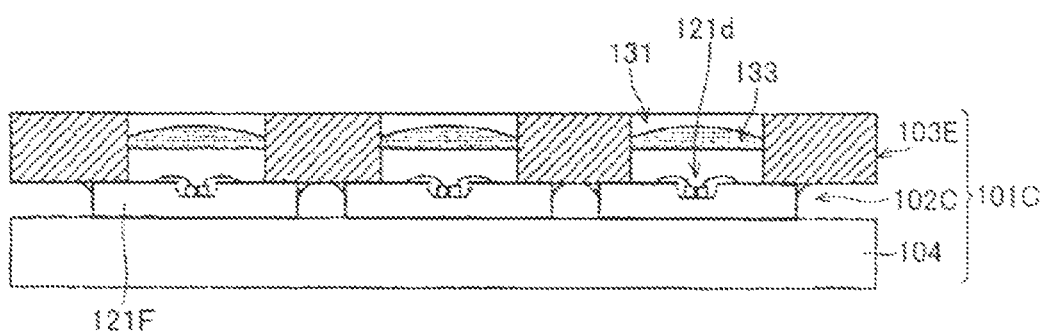
FIG. 47 is a cross sectional view illustrating an arrangement of a main part of an LED lighting apparatus of Tenth Embodiment of the present invention.
Figure 48:
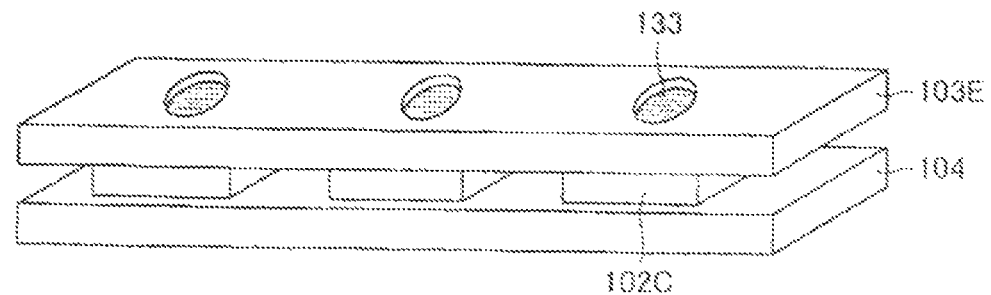
FIG. 48 is a perspective view of the LED lighting apparatus shown in FIG. 47.

In the arrangement of Tenth Embodiment of the present embodiments, lens means for preventing dispersion of light is provided in a window section 131 of a connecting substrate 103. FIG. 47 is across sectional, view illustrating an arrangement of a major part of an LED lighting apparatus of the Tenth embodiment of the present invention. FIG. 48 is a perspective view illustrating the arrangement of the LED lighting apparatus shown in FIG. 47.

In FIG. 47 and FIG. 48, an LED lighting apparatus 101C includes a lens function element 133 that serves as a lens means in the window section 131 which is provided in a connecting substrate 103E. The lens function element 133 receives the radial light from an LED element substrate 102C, and converts the radial light into the parallel light.

The lens function element 133 is fitted within the window section 131 so that the surface of the lens function element 133 does not stick out from a top surface of the connecting substrate 103E. A bottom surface of the ceramic substrate 121F (a surface opposed to the surface from which the light is gone out) is combined with the radiator device 104, like the Seventh Embodiment.

Note that the radiator device 104 may be provided on the side end face of the ceramic substrate 121, like the Seventh Embodiment. In this case, a collimating lens, for example, may be provided as the lens function element 133 within the window section 131.

Figure 50:
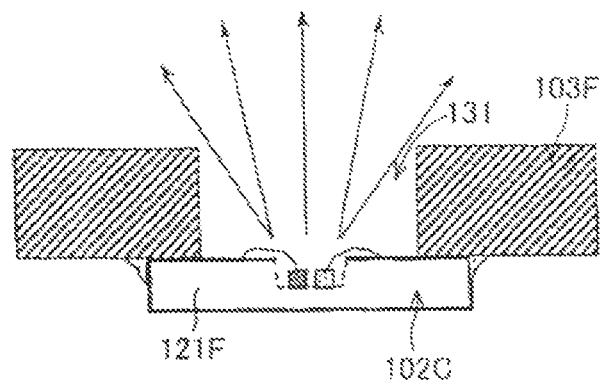
FIG. 50 is a cross sectional view illustrating optical paths of the light emitted from LED chips in cases where no lens function element is provided in the window section of the connecting substrate.

As shown in FIG. 50, in cases where no lens function element is provided within the window section 131 of the connecting substrate 103F, the light from the LED element substrate 102C is radially emitted upward even though the width and the depth of the window section 131 suppress, to some extent, the dispersion of the light emitted from the LED element substrate 102C.

Figure 51:
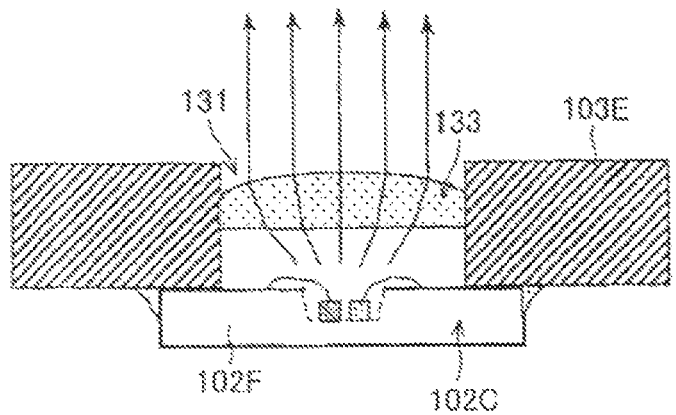
FIG. 51 is a cross sectional view illustrating optical paths of the light emitted from LED chips in cases where a lens function element is provided in the window section of the connecting substrate.

On the contrary, as shown in FIG. 51, the lens function element 133, provided within the window section 131 of the connecting substrate 103E, changes the direction of the light from the LED element substrate 102C such that the light from the LED element substrate 102C is directed perpendicularly upward and without any dispersing. On this account, it is possible to greatly improve the efficiency of light incident on the light guide plate 112. This is because the reflection of the light incident obliquely substantially diminishes.

Figure 49:
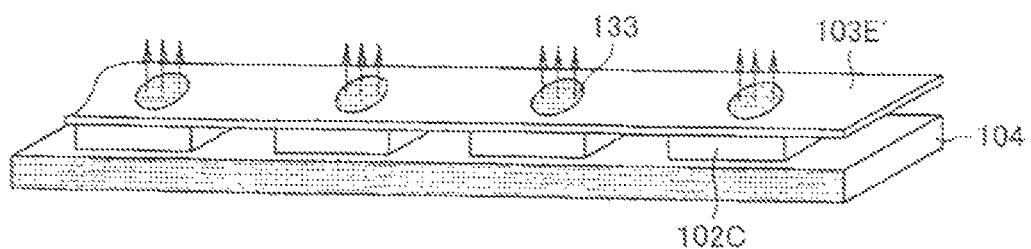
FIG. 49 is a perspective view illustrating another arrangement of the LED lighting apparatus shown in FIG. 47.

Note that as shown in FIG. 49, even in case where a connecting substrate 103E' has a thin thickness, the lens function element 133 may stick out from the connecting substrate 103E', provided that the light guide plate 112 has a concave section which engages a convex section of the lens function element 133.

[Eleventh Embodiment]

Figure 52:
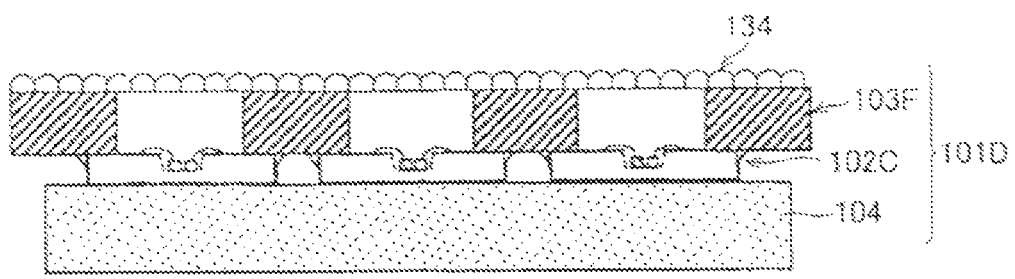
FIG. 52 is a cross sectional view illustrating an arrangement of an LED lighting apparatus of Eleventh Embodiment of the present invention.

In the arrangement of the Tenth Embodiment, the lens means for preventing the light from dispersing is fitted within the window section 131 of the connecting substrate 103. In Eleventh Embodiment of the present embodiments, a plurality of micro lenses on a transparent sheet member are provided as lens means on an upper surface of the connecting substrate 103. FIG. 52 is a cross sectional view illustrating an arrangement of an LED lighting apparatus 101D of the Eleventh Embodiment of the present invention. In FIG. 52, this LED lighting substrate 101D includes an LED element substrate 102C, a connecting substrate 103F provided on the LED element substrate 102C, a lens function element 134 provided on the connecting substrate 103F, and a radiator device 104 provided under the LED element substrate 102C.

The lens function element 134 includes the transparent sheet member (a lens sheet, not shown), and the micro lenses provided in a line or in a plurality of lines on the transparent sheet member. The transparent sheet member and the micro lenses are provided on a top surface of the connecting substrate 103F the top surface indicating a surface opposed to a surface on which the LED element substrate 102C is provided. According to the arrangement, the parallel light enters to the light guide plate 112 without being dispersed like the lens function element 133 shown in FIG. 47. On this account, it is possible to greatly improve the efficiency of light incident on the light guide plate 112.

Note that the transparent sheet member of the lens function element 134 may be attached onto the connecting substrate 103F with an adhesive agent. In cases where the connecting substrate 103F is made of a transparent and colorless material (light transmittance material), a window section does not need to be provided. It is possible to integrally provide the lens function element 134 (or the lens function element 133) with the connecting substrate 103F.

[Twelfth Embodiment]

In the arrangement of the Tenth Embodiment, lens means is used, and in the arrangement of the Eleventh Embodiment, micro lens means is used. In the Twelfth Embodiment, lens means is realized by shaping, in a dome manner, a surface of a resin by which the molding was carried out with respect to LED chips 122 and a connecting wire 123.

Figure 53:
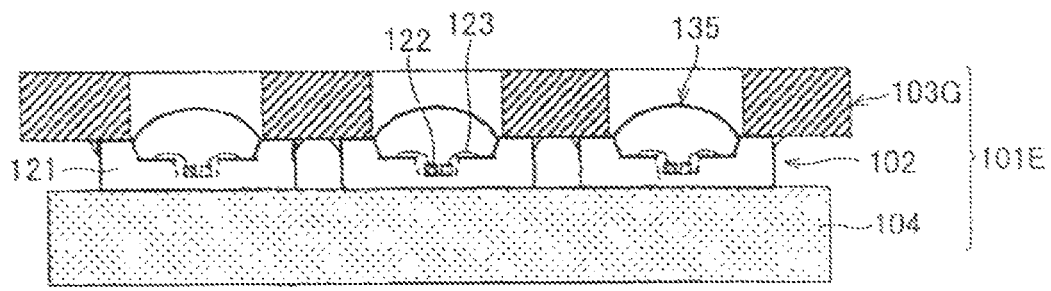
FIG. 53 is a cross sectional view illustrating an arrangement of an LED lighting apparatus of Twelfth Embodiment of the present invention.
Figure 54:
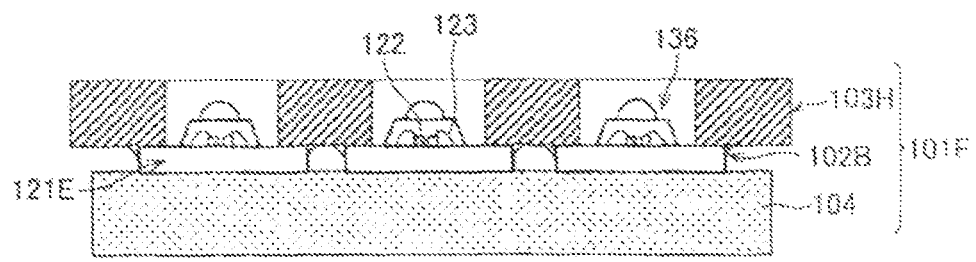
FIG. 54 is a cross sectional view illustrating another arrangement of the LED lighting apparatus shown in FIG. 53.
Figure 55:
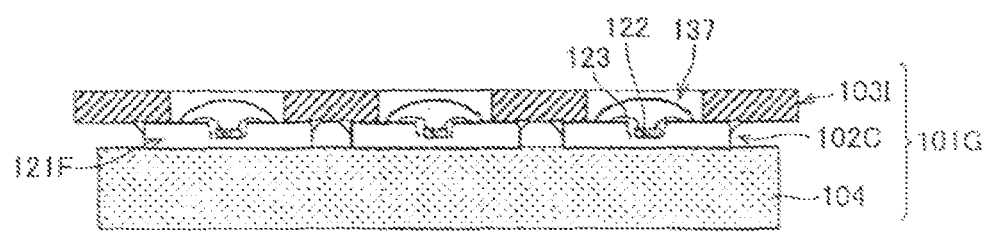
FIG. 55 is a cross sectional view illustrating still another arrangement in the LED lighting apparatus shown in FIG. 53.

FIG. 53 through FIG. 55 are cross sectional view illustrating arrangements of an LED lighting apparatus of the Twelfth Embodiment in accordance with the present invention. In each of the LED lighting apparatuses (light source apparatuses) 101E through 101G, as shown in FIG. 53 through FIG. 55, each surface (upper surface) of the resin by which the molding was carried out with respect to the LED chips 122 and the connecting wires 123 is shaped in a dome manner (in a concave lens manner). The lens function obtained by the shaping in a dome manner also allows the great improvement in the efficiency of the light incidence without dispersing the light to a light guide plates (not shown), like the lens function element 133 shown in FIG. 47. Note that lens function elements 135 through 137 may be realized by molding the molding resins with the use of a mold having a shape of dome.

[Thirteenth Embodiment]

In the Thirteenth Embodiment, as shown in FIG. 56, on a top surface of a connecting substrate 103F, a transparent sheet member containing a fluorescer is provided. The fluorescer reacts the light emitted from the LED chip 122 so as to obtain a desired emission color.

FIG. 56 is a cross sectional view showing an arrangement of an LED lighting apparatus of the Thirteenth Embodiment in accordance with the present invention. In FIG. 56, an LED lighting apparatus 101H includes a concave section 121d provided in the ceramic substrate 121F. Within the concave section 121d, an LED chip 122a whose emission color corresponds to blue or a ultra violet region is provided with its bottom surface made contact with the ceramic substrate 121F. The LED chip 122a is die-bonded to a wiring pattern, (not shown) provided within the concave section 121d, at its predetermined position.

An electrode of the LED chip 122a is wire-bonded to a wiring pattern (not shown), provided around the upper surface of the ceramic substrate 121F, at its predetermined position via a connecting wire 123, thereby preparing an LED element substrate 102C.

A transparent sheet member 138 containing a fluorescer is provided on a top surface of the connecting substrate 103. When the fluorescer reacts the light emitted from the LED chip 122, the fluorescer is excited by the light, the transparent sheet member 138 emits a predetermined colored light which is different color from the light emitted from the LED chip 122a.

The light emitted from the LED chip 122a is mixed with the light reflected (irradiated) by the transparent sheet member 138, thereby obtaining a desired colored light such as white colored light. The provision of the transparent sheet member 138 allows the step of mixing a fluorescer to the LED chip 122a to be omitted. On this account, it is possible to greatly improve the manufacturing efficiency.

Note that the Thirteenth Embodiment deals with the case where a transparent sheet member containing a fluorescer is provided, however, the present invention is not limited to this. For example, in cases where the LED chip 122a and the connecting wire 123 are molded by a resin, it is possible to obtain a similar effect when a fluorescer is added to the molding resin.

Note also that in the Thirteenth Embodiment, the concave section 121d, where the LED chip 122a is provided, may include two concave sections: a deep concave section 121a and a shallow concave section 121b, as described in Seventh Embodiment.

The shallow concave section 121b is provided around the deep concave section 121a formed.

Figure 57:
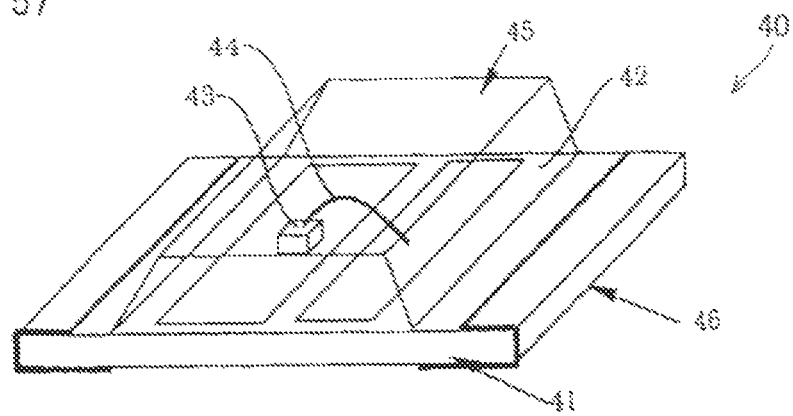
FIG. 57 is a perspective view illustrating an arrangement of a conventional LED element substrate.

Incidentally, well-known arrangements of conventional LED lighting apparatuses are shown in FIG. 57 through FIG. 61. FIG. 57 is a perspective view illustrating an arrangement of a conventional LED element substrate. In FIG. 57, in a LED element substrate 40, wiring patterns 42 are provided on a resin substrate 41 made of glass-epoxy resin or other material. A single LED chip 43 or a plurality of LED chips 43 (in case where a plurality of LED chips are provided, their colors are different from each other) are die-bonded to the wiring patterns 42.

An electrode of the LED chip 43 (the electrode is provided on the light-emitting surface of the LED chip 43) is wire-bonded to one of the wiring patterns 42, at a predetermined position, via a connecting wire 44 made of gold or the like. The LED chip 43 and the connecting wire 44 are covered and sealed with a molding resin 45 such as epoxy resin or the like. Electrode wiring terminals 46, which electrically carries out external connections of the LED element substrate 40A, are provided so as to extend and bridge between a part of a bottom surface of the resin substrate 41 and a part of a top surface of the resin substrate 41 via a side surface of the resin substrate 41, the bridged parts being like a U-shaped.

Figure 58:
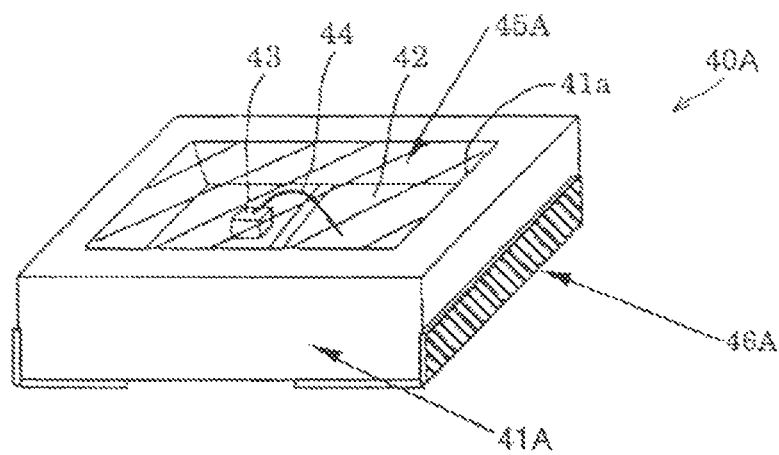
FIG. 58 is a perspective view illustrating another arrangement of the conventional LED element substrate.

In the meantime, another arrangement of a well-known conventional LED element substrate is shown in FIG. 58. In FIG. 58, an LED element substrate 40A includes a concave section 41a in a resin substrate 41A. Within the concave section 41a, wiring patterns 42 are provided. A single or a plurality of LED chips 43 (in the case where a plurality of LED chips are provided, their colors are different from each other) are die-bonded by a solder (not shown in the figure) or the like to the wiring patterns 42.

In this case, the LED chip 43 is soldered with its bottom surface made contact with the resin substrate 41A. An electrode of the LED chip 43 (the electrode is provided on the light-emitting surface of the LED chip 43) is wire-bonded to one of the wiring patterns 42, at a predetermined position, via a connecting wire 44 made of gold or the like. The concave section 41a is covered and sealed with a molding resin 45A such as epoxy resin or the like. Electrode wiring terminals 46, which electrically carries out external connections of the LED element substrate 40A, are provided so as to extend and bridge between a part of a bottom surface of the resin substrate 41 and a part of a side surface of the resin substrate 41, the bridged parts being like an L-shaped.

In cases where an LED lighting apparatus, such as a light source for illumination, is arranged by using the conventional LED element substrate 40 or 40A shown in FIG. 57 and FIG. 58, a plurality of LED element substrates 40 or 40A are attached to a connecting substrate 47, made of a glass-epoxy resin or the like, by solders 47a or the like (see FIG. 59 or FIG. 60) in a single line or in a plurality of lines. Here, the LED chips 43 are provided with their bottom surfaces made contact with the resin substrates 41 or 41A.

Figure 59:
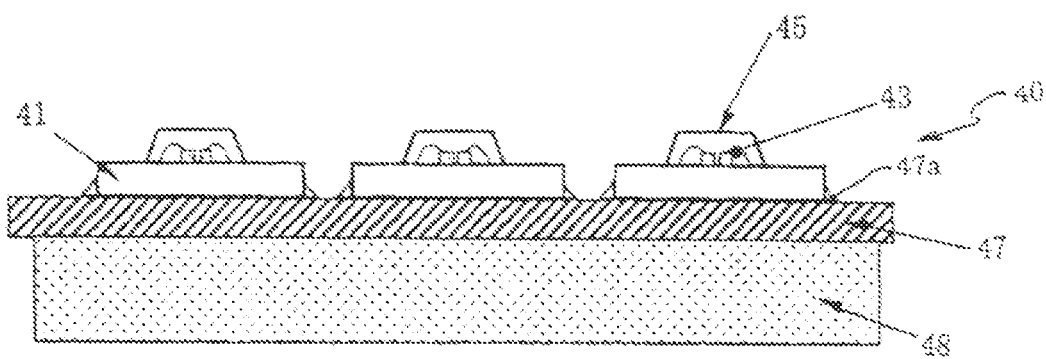
FIG. 59 is a cross sectional view illustrating an arrangement of a conventional LED lighting apparatus.
Figure 60:
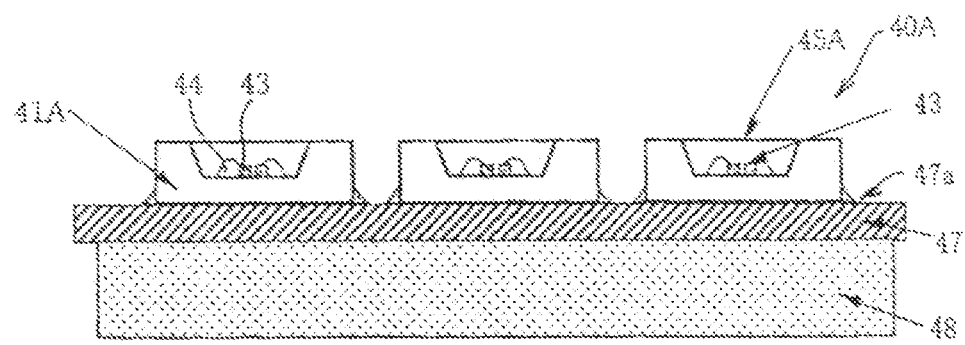
FIG. 60 is a cross sectional view illustrating another arrangement of the conventional LED lighting apparatus.

Further, for example, in cases where the LED lighting apparatuses are used in an LCD backlight apparatus or a variety of lighting apparatuses, a large current is required for driving the LED lighting apparatuses. Therefore, the heat caused by the large current driving should be fully radiated. In this case, as shown in FIG. 59 and FIG. 60, a radiator device 48 such as heatsink is provided on a bottom surface of the connected surface 47.

Figure 61:
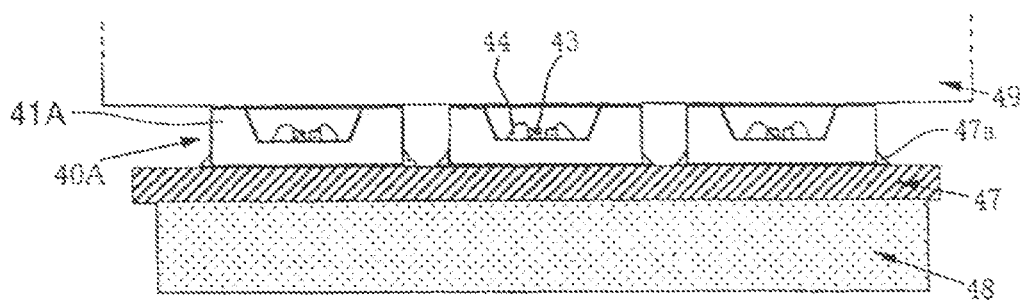
FIG. 61 is a cross sectional view illustrating a conventional LCD backlight module.
Figure 62:
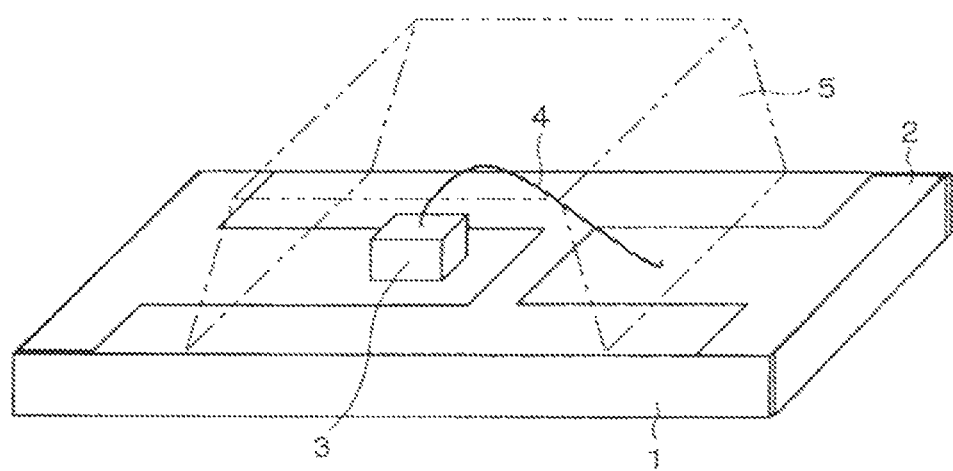
FIG. 62 is a perspective view illustrating a conventional light-emitting apparatus.
Figure 63:
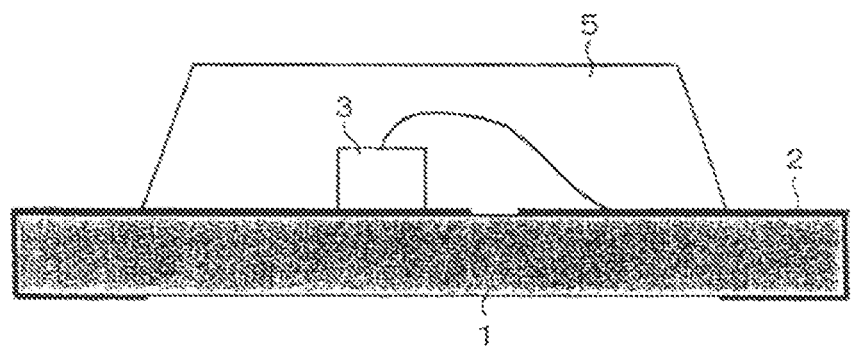
FIG. 63 is a cross sectional view illustrating the conventional light-emitting apparatus.
Figure 64:
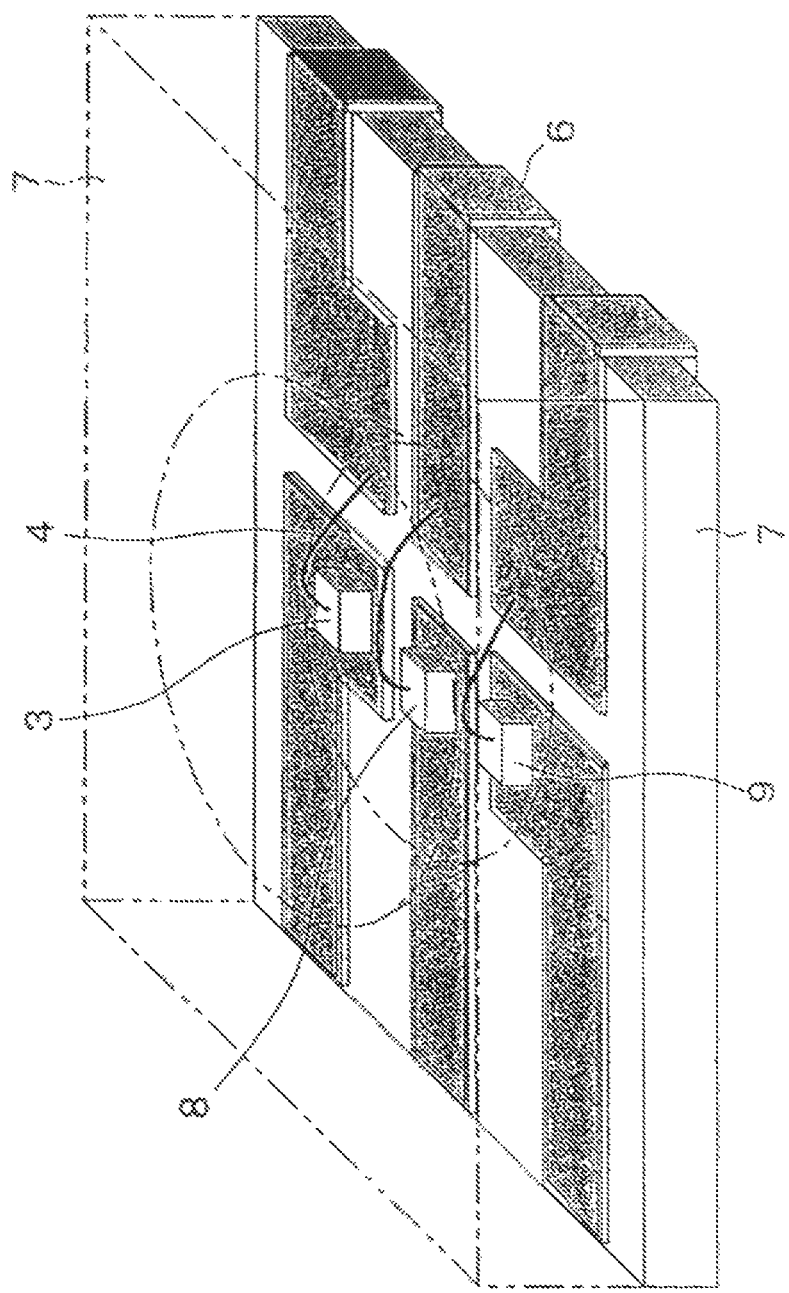
FIG. 64 is a perspective view illustration of another conventional light-emitting apparatus.
Figure 65:
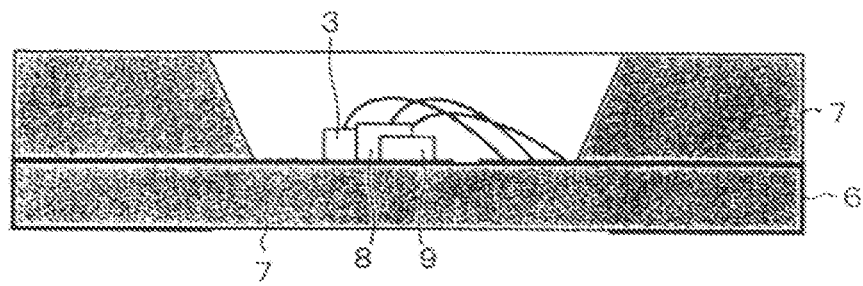
FIG. 65 is a cross sectional view illustrating the conventional light-emitting apparatus shown in FIG. 64.
Figure 66:
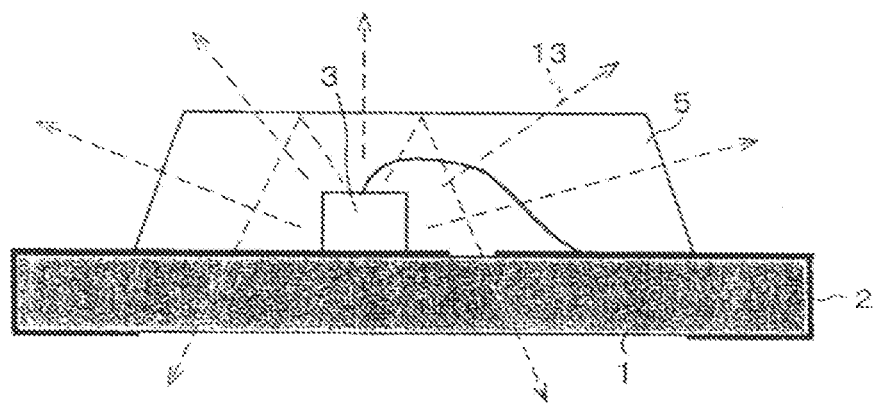
FIG. 66 is a cross sectional view illustrating optical paths of the light emitted from the light-emitting device of the conventional light-emitting apparatus.
Figure 67:
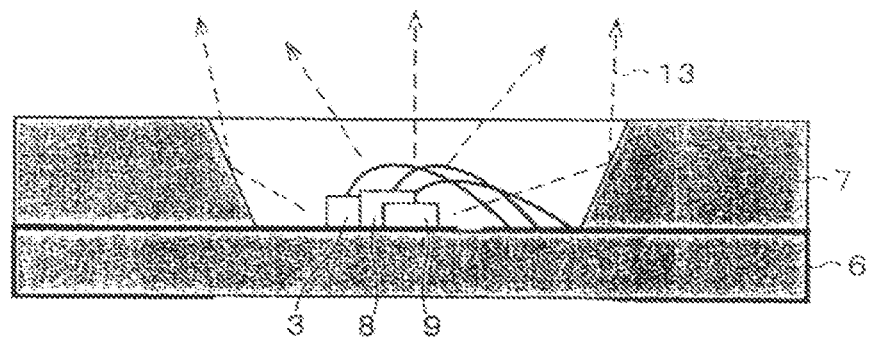
FIG. 67 is a cross sectional view illustrating optical paths of the light emitted from a light-emitting device of the conventional light-emitting apparatus shown in FIG. 64.
Figure 68:
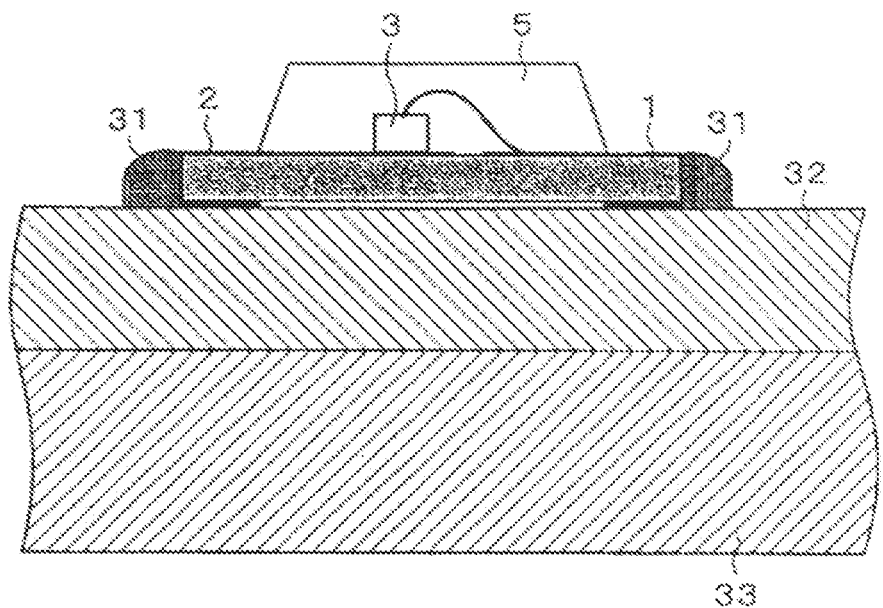
FIG. 68 is a cross sectional view illustrating how the light emitting apparatus shown in FIG. 62 is mounted on the connecting substrate and how the radiator device is mounted.
Figure 69:
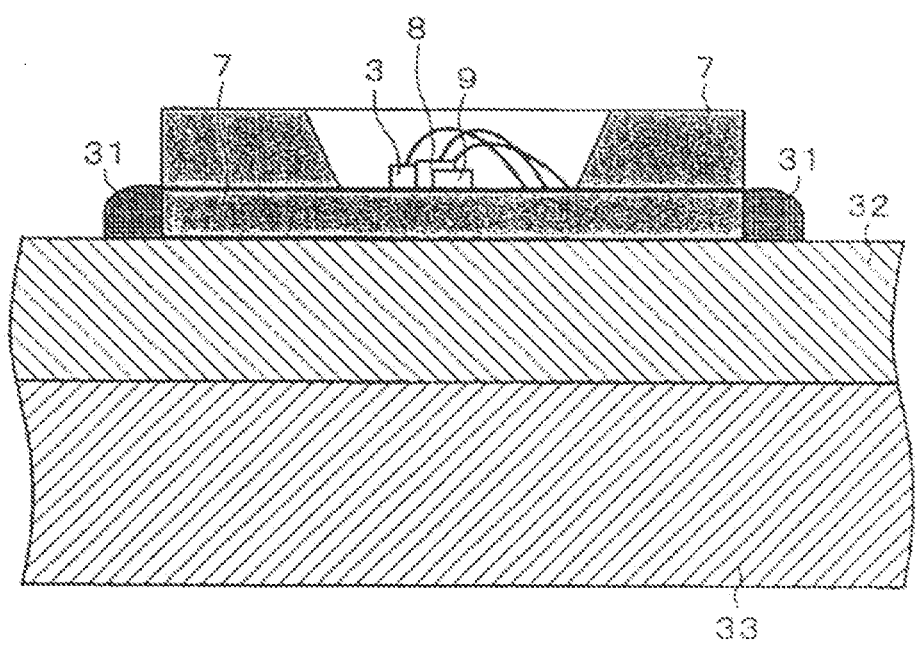
FIG. 69 is a cross sectional view illustrating how the light emitting apparatus shown in FIG. 64 is mounted on the connecting substrate and how the radiator device is mounted.

As shown in FIG. 61, the LED lighting apparatuses are provided such that the light from the LED element substrate 40A is entered into a side surface of an light guide plate 49 of the back light apparatus.

For example, a modified example of the LED element substrate 40A shown in FIG. 58 is disclosed in Japanese Publication for Unexamined Patent Application No. 7-38154 (Tokukaihei 7-38154, published on Feb. 7, 1995). In the publication, an LED element substrate is arranged such that two groove sections are provided in a top surface of two facing outer walls among four outer walls surrounding the concave section 41a. The groove section has a predetermined width, communicates between the concave section 41a and its outside, and has a depth that is shallower than the height of the concave section 41a. An electrode of the LED chip 43 is wire-bonded to a wiring pattern provided on a bottom surface of the groove section via a connecting wire 44.

According to the LED element substrate disclosed in Japanese Publication for Unexamined Patent Application No. 7-38154, (i) the resin for the sealing is required only for a small area where the concave section 41a and the groove section are provided, and (ii) the connecting wire 44 is connected in the bottom surface of the groove that is shallower than the concave section 41a. This ensures to suppress the resin amount for the concave section 41a and the groove sections.

On this account, it is possible to reduce the effect caused by the heat and/or stress, thereby improving reliability. In cases where a plurality of LED chips whose emission colors are different from each other are provided, an interval between the LED chips becomes shorter because of the small area of the concave section 41a, thereby attaining uniform color mixture of the light emitted from the respective LED chips.

Furthermore, since the groove sections can be prepared during the manufacturing process by dividing the grooves provided between the concave sections, it is possible to easily adjust the resin amount based on the squeegee method during filling the resin in the concave section, thereby promoting an efficiency of mass-production processes of the LED element substrate.

In the meantime, described in Japanese Publication for Unexamined Patent Application No. 6-230731 (Tokukaihei 6-230731, published on Aug. 19, 1994) is an LED display apparatus in which (i) a LED chip facing a light transmittance substrate and a driver IC are provided on a bottom surface of the light transmittance, and (ii) an anode electrode of the LED chip is connected to a wiring pattern on the light transmittance substrate via a bump.

According to the publication, even in case where the LED display apparatus is a high-definition display apparatus having a large number of dots, the electrode of the LED chip and the wiring pattern are connected via the bump. Accordingly, it is possible to avoid the increasing of the manufacturing steps and the lowering of yield ratio without increasing the number of the connecting wires. Also, because no connecting wire is provided in an area near the light-emitting surface of the LED chip, the light emitted from the LED chip is not reflected by the connecting wire, thereby improving an optical characteristic. Further, because no LED chip is provided a surface of the substrate through which the light gone out, i.e., is flat, it is possible to obtain a good optical characteristic. Furthermore, when a radiator member is provided on a bottom surface that is opposed to a surface where the LED chip is provided, the heat from the LED chip can be efficiently radiated. The radiator member can be used as a wiring member for connecting the wiring pattern of the substrate having proper light transmittance to the electrode of the LED chip.

In the meantime, disclosed in Japanese Publication for Unexamined Patent Application No. 2001-284659 (Tokukai 2001-284659, published on Oct. 12, 2001) is an LED lighting apparatus in which, (i) on a surface of a metal substrate, a metal container having a hollow section which is filled with liquid having a heat conduction, and (ii) an electrically insulated layer on the metal container, a wiring pattern which is electrically connected to an LED chip.

According to the LED lighting apparatus, the heat caused by the LED chip is conveyed to a lead section of the LED chip, the wiring pattern, the electrically insulated layer, and the metal container in this order. Then, the heat is conveyed to the liquid which fills the hollow section, and spreads over the entire metal container, and finally the heat is radiated into the air. In this case, because the substrate is made of metal, the heat is efficiently conveyed to the metal from the entire metal container. On this account, the heat from the LED chip is efficiently radiated, thereby respectively improving luminous efficiency and duration of life of the LED lighting apparatus.

However, in the conventional LED lighting apparatus shown in FIG. 61, the radiator device 48 such as heatsink is provided on the bottom surface of the connecting substrate 47 (the surface (bottom surface) opposed to the surface where the LED element substrate is provided). On this account, the heat generated by the Led chip 43 is conveyed to the radiator device 48 via (i) the resin substrate 41A constituting the LED element substrate 40A and (ii) the connecting substrate 47.

Here, because the resin substrate 41A and the connecting substrate 47, those of which are provided between the LED chip 43 and the radiator device 48, are made of resin, heat-conduction of the LED lighting apparatus is poor. This causes a problem that the heat is not sufficiently radiated from the LED lighting apparatus. The problem also occurs in cases where the LED element substrate 40 is used.

Further, in cases where a void space is formed between the resin substrate 41A and the connecting substrate 47, a layer of air is formed therebetween. This may deteriorate the heat-conduction worse.

Accordingly, in the LED lighting apparatus, driven by a large current, such as a light source, the large amount of current consumption increases an amount of the heat from the LED chip 43. On this account, more heat stress is imposed on the LED element substrate 40A and sufficient luminosity cannot be obtained. This causes a problem of reliability of the light-emitting property.

On the other hand, according to the LED element substrate disclosed in the above-mentioned Japanese Publication for Unexamined Patent Application No. 7-38154, it is intended to reduce the effect due to the heat stress by reducing amount of resin for sealing the concave section and the groove sections. However, this conventional art does not take any account of the heat conduction between the LED chips served as the heat generation source and the radiator device. Therefore, a similar problem to that of the foregoing conventional LED lighting apparatus.

The present invention is made to solve the conventional problem, and its object is to provide (i) a lighting apparatus which can efficiently carry out the radiation from the LED chip to the radiator device with a simplified structure, (ii) a backlight apparatus in which the lighting apparatus is used, and (iii) a display apparatus in which the backlight apparatus is used.

To achieve the object, a lighting apparatus (another type of light-emitting apparatus) of the present invention includes one or more light-emitting devices for emitting light by converting a current into the light; at least one light-emitting device substrate on a top surface of which at least one of the one or more of the light-emitting devices is provided; a heat-discharging member bonded to at least one of a bottom surface and side surfaces of the light-emitting device substrate.

Preferably, the lighting apparatus of the present invention is so arranged that only an adhesive agent and the light-emitting device substrate are provided between the light-emitting device and the heat discharging member, the adhesive agent for die-boding the light-emitting device and the light-emitting device substrate.

More preferably, the lighting apparatus of the present invention is so arranged as to include a connecting substrate, provided on the top surface of the light-emitting device substrate, having a predetermined wiring pattern for supplying electricity to said one or more light-emitting devices, the connecting substrate having a light-transmitting section provided in a position, corresponding to a position of said one or more light-emitting devices.

More preferably, the lighting apparatus of the present invention is so arranged that the light-emitting device substrate includes a electrode-wiring terminal in at least one of both edges of the surface of the light-emitting device substrate, the electrode-wiring terminal for establishing connection with a predetermined wiring pattern provided on the connecting substrate.

More preferably, the lighting apparatus of the present invention is so arranged that a plurality of the light-emitting device substrates are arranged in one or more lines and the predetermined wiring patterns of the plurality of the light-emitting device substrates are electrically connected with electrode-wiring terminal of the connecting substrate.

More preferably, the lighting apparatus of the present invention is so arranged that the light-emitting device substrate is a ceramic substrate, that is, the light-emitting device substrate of the lighting apparatus of the present invention is a ceramic substrate.

More preferably, the lighting apparatus of the present invention is so arranged that the light-emitting device is a light-emitting diode.

More preferably, the lighting apparatus of the present invention is so arranged that a plurality of the light-emitting devices emit light in different colors from the others.

More preferably, the lighting apparatus of the present invention is so arranged that the light-emitting device is die-bonded to a predetermined position of the wiring pattern provided on the top surface of the light-emitting device substrate, and an electrode of the light-emitting device is wire-bonded to another predetermined position of the wiring pattern via a connecting wire.

More preferably, the lighting apparatus of the present invention is so arranged that a concave section is provided on the surface of the light-emitting device substrate, the light-emitting device being die-bonded to a predetermined position of a wiring pattern provided within the concave section.

More preferably, the lighting apparatus of the present invention is so arranged that the concave section includes a deeper concave section in a center section thereof, and a shallower concave section around the deeper concave section, and the light-emitting device is die-bonded to a predetermined position of a wiring pattern provided within said deeper concave section, whereas an electrode of said light-emitting device is wire-bonded to a predetermined position of a wiring pattern provided within said shallower concave section.

More preferably, the lighting apparatus of the present invention is so arranged that the light-emitting device is die-bonded to a predetermined position of a wiring pattern provided on a flat surface of the light-emitting device substrate.

More preferably, the lighting apparatus of the present invention is so arranged that the light-transmitting section includes a lens means for preventing dispersion of light that is emitted from the light-emitting device.

More preferably, the lighting apparatus of the present invention is so arranged that the light-transmitting section is a window section.

More preferably, the lighting apparatus of the present invention is so arranged that the lens means is fitted in the window section so that the lens means is not protruded out above the top surface of the connecting substrate.

More preferably, the lighting apparatus of the present invention is so arranged that the lens means is a micro lens.

More preferably, the lighting apparatus of the present invention is so arranged that the micro lens mean includes the micro lens means includes: a transparent sheet member; and a plurality of the micro lenses on said transparent sheet member, the plurality of the micro lenses arranged in one or more lines.

More preferably, the lighting apparatus of the present invention is so arranged that the connecting substrate is made of a transparent material having no color; and the lens means is incorporated in the connecting substrate.

More preferably, the lighting apparatus of the present invention is so arranged that a periphery of the light-emitting device and a periphery of the connecting wire are molded with resin.

More preferably, the lighting apparatus of the present invention is so arranged that at least the resin molding the periphery of the light-emitting device has a dorm-like shape and constitutes the lens means.

More preferably, the lighting apparatus of the present invention is so arranged that the resin contains a fluorescer, which emits light in a desired color by being exited by the light emitted from the light-emitting device.

More preferably, the lighting apparatus of the present invention is so arranged that the connecting substrate includes, on a surface thereof, a transparent sheet member containing a fluorescer, which emits light in a desired color by being exited by the light emitted from the light-emitting device, the surface being reverse to the surface that faces the light-emitting substrate.

More preferably, the lighting apparatus of the present invention is so arranged that the light-emitting device emits light in a color in a blue or a ultra violet region.

To achieve the object, a backlight apparatus of the present invention includes (i) any one of the foregoing light-emitting apparatuses, and (ii) a light guide plate whose light-receiving surface faces a light-emitting surface of said light-emitting apparatus, said light guide plate propagating therethrough light received on said light-receiving surface, and then emitting the light from a surface.

To achieve the object, a display apparatus of the present invention may include a display panel having a pair of substrates, which sandwich a displaying medium therebetween, said display panel displaying by applying a display voltage between the substrates, a backlight apparatus provided on a bottom surface of said display panel.

More preferably, the display panel of the present invention is a liquid crystal display panel in which the displaying medium is a liquid crystal layer sandwiched between the pair of the substrates, and said liquid crystal display panel displaying by changing orientation of a liquid crystal molecule in each of picture elements by applying a display voltage between the substrates, the picture elements being arranged in matrix.

According to the foregoing arrangement, an effect of the present invention is explained below.

In the arrangement of the present invention, there is only light-emitting device substrate (a ceramic substrate, for example) between a light-emitting device (such as a light-emitting diode chip; hereinafter referred as an "LED chip") and a heat-discharging member (a radiator device; a heat-discharging element). In other words, the arrangement of the present invention is much simpler than an arrangement of a conventional art, in which a resin connecting substrate is further provided to these members. Therefore, according to the present invention, it is possible to more efficiently conduct heat to heat-discharging element from the LED chip.

Further, in case where the light-emitting device substrate is, for example, a ceramic substrate having proper heat-conductivity, this allows heat to be conducted further efficiently to the heat-discharging element from the LED chip.

Furthermore, a connecting substrate, which has a light-transmitting section such as a window section in that area of the connecting substrate which corresponds to an area that the light-emitting device is provided, is provided on the upper surface of light-emitting device substrate. On the account of this, the window section prevents light from dispersing; the incident angle of the light entering the light guide plate is prevented to be larger; and reflection from the light-receiving surface of the light guide plate is suppressed. Thereby, luminance of the display apparatus is improved.

Here, explained is a problem to be solved for improving the efficiency in entering the light into the light guide plate, wire reference to the conventional art described above.

In case where an LED lighting apparatus is used as a light source of an LCD backlight apparatus, light is directed from an LED element substrate 40A to a light guide plate 49. In this case, the light emitted from an LED chip 43 is radially dispersed, and enters the light-receiving surface of the light guide plate 49 at angles including not only the right angle but also non-orthogonal angles. On the account of this, the light is reflected in the light-receiving surface of the light guide plate 49, thereby raising a problem that efficiency of light entering the light guide plate 49 (in other words, efficiency of light reception in the light guide plate 49) decreases.

Moreover, an LED display apparatus described in the above-mentioned Japanese Publication for Unexamined Patent Application No. 6-230731, is so arranged that no connecting wire is provided in a vicinity of a front of the light-emitting section, and that surface of the substrate from which transmission light exits is flat because LED chip is not provided on the surface, thereby obtaining good optical characteristic. However, in the arrangement, the efficiency of light entering the light guide plate from the LED chip is not taken into account. Therefore, there is a possibility that the problem of the efficiency of the light entering the light guide plate occurs in the arrangement, too.

The present invention is made to solve the foregoing problem. According to the present invention, it is possible to more efficiently convey heat to the heat-discharging element from the LED chip with such a simple arrangement. Further, according to the present invention, efficiency of light entering the light guide plate from the LED chip increases, thereby improving luminance of the display apparatus.

It is possible to attain better heat radiation efficiency and the efficiency in entering the light by the simple arrangement in which the light-emitting device mounting device is provided between the connecting substrate and the heat-discharging member in addition to the conventional arrangement in which the connecting substrate is provided between the light-emitting device mounting substrate and the heat-discharging member.

Thereinafter, this is described in further details.

In the arrangement of the present invention, an LED chip is die-bonded to a wiring pattern provided on a flat ceramic substrate or on a ceramic substrate provided with a concave section formed in a surface of the substrate. The LED chip is so die-bonded on the substrate that a surface of the LED which faces the ceramic substrate is a reverse surface of a light-emitting surface of the LED. A heat-discharging element such as a heatsink is bonded to that surface of the ceramic substrate which is reverse to a light-emitting surface of the ceramic substrate, or to one of side surfaces of the ceramic substrate. (The side surfaces of the ceramic substrate are the surfaces vertical to the light-emitting surface or the reverse surface of the ceramic substrate.) On the account of this, heat generated from the LED chip due to supply of electricity is conducted to the heat-discharging element only via the ceramic substrate and an adhesive agent that die-bonds the LED chip to the ceramic substrate.

Meanwhile, the connecting substrate is provided on that surface of the ceramic substrate in which the light-emitting device is provided. Therefore, according to the arrangement, heat is more efficiently conducted than in the conventional arrangement in which sufficient heat discharge cannot be performed due to poor heat conduction caused by the resin substrate and the connecting substrate provided between the LED chip and the heat-discharging element.

Electrode-wiring terminals are provided in areas near both edges of the upper surface of the ceramic substrate. The electrode-wiring terminals are connected to the connecting substrate by a solder or the like method. Furthermore, the heat-discharging element may be provided on at least any one of (i) the top surface of the ceramic substrate and (ii) the side surfaces of the ceramic substrate.

According to the lighting apparatus of the present invention, heat-discharging efficiency is increased. Therefore, the lighting apparatus of the present invention is suitable for apparatuses driven by a large amount of electricity such as (i) a backlight apparatus and (ii) a variety of light sources for lighting apparatus.

In case where the lighting apparatus of the present invention is used for a backlight apparatus, a lens mean (or a lens function element) which converts the radial light to the parallel light is provided in a position corresponding to a light-transmitting section such as a window section provided in the connecting substrate. This allows the light to enter the light-receiving surface of the light guide plate perpendicularly, thereby further improving efficiency in entering the light into the light guide plate. On the account of this, in a display apparatus in which the backlight apparatus is used, better luminance can be attained.

The LED chip may be one LED chip or multiple LED chips having different colors respectively. In case where an LED has color which corresponds to blue or the ultra violet region, a fluorescer may be added in the molding resin. In case where the fluorescer is added, the fluorescer is excited by the light emitted from the LED chip, whereby a desired color is obtained. Moreover, the present invention may be so arranged that a transparent sheet member containing the fluorescer is provided on the reverse surface of the connecting substrate. The reverse surface is reverse to that surface of the connection substrate on which the LED chip is provided. Again in this arrangement, the fluorescer is excited by the light emitted from the LED chip, whereby a desired color is obtained.

The concave section where the LED chip is provided may be constituted by two concave sections; a shallower concave section is provided so as to surround an aperture of a deeper concave section. This arrangement allows the wiring pattern provided on the surface of the shallower concave section to be wire-bonded to an electrode of the LED chip, thereby lessening amount of resin and lessening further stress when thermal stress is imposed, as in the arrangement described in Japanese Publication for Unexamined Patent Application No. 7-38154.

As described above, according to the present invention, heat generated from the light-emitting device when the light-emitting device emits light is conducted directly to the heat-discharging element from the light-emitting device substrate—whereas in the conventional arrangement, the heat is conducted via the connecting substrate. This arrangement improves heat conduction. This enables display drive in which a large amount of electricity is used, thereby making it possible to improve luminance of the display apparatus.

With this arrangement, thermal stress imposed on the light-emitting device is lessened, thereby improving reliability. Further, in case where the light-emitting device substrate is a ceramic substrate, instead of a resin substrate in the conventional arrangement, heat can be conducted more efficiently to the heat-discharging element from the light-emitting device.

Also in the arrangement of the present invention, a connecting substrate having a light-transmitting section such as a window section provided in an area corresponding to the light-emitting device is provided on the upper surface of the light-emitting device substrate. The light passing through the window section will enter the light guide plate at a wide incident angle, thereby suppressing the reflection of the light from the light-entering surface of the light guide plate. This attains dramatic improvement in the efficiency in entering the light from the light-emitting device to the light guide plate, thereby attaining better display luminance.

Further, the lens means provided in the window section of the connecting substrate or the like converts the light emitted from the light-emitting device, which is radial light, into the parallel light, thereby enabling the light to enter the light-receiving surface of the light guide plate vertically. On the account of this, efficiency of light entering the light guide plate is improved, thereby improving luminance of the display apparatus.

Furthermore, according to the present invention, because the fluorescer is excited by that light, whose color corresponds to blue or the ultra violet region, emitted from the light-emitting device, a desired color can be obtained without using multiple light-emitting devices having different colors respectively.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A light-emitting apparatus comprising:
a ceramic package;
a conductive pattern formed on a mounting area of said ceramic package;

a light-emitting device mounted on the mounting area of said ceramic package, including an electrode provided on a bottom of said light-emitting device that faces said conductive pattern and is connected to said conductive pattern; and a metal layer below the mounting area and buried in said ceramic package, a thickness between a top surface of said metal layer and a top surface of said ceramic package at the mounting area being smaller than a thickness between a bottom surface of said metal layer and a bottom surface of said ceramic package.

2. The light-emitting apparatus of claim 1, further comprising a diode provided on said ceramic package and electrically connected to said light-emitting device.

3. The light-emitting apparatus of claim 2, wherein said diode is a light-emitting diode.

4. The light-emitting apparatus of claim 2, wherein said ceramic package contains alumina.

5. The light-emitting apparatus of claim 4, wherein said light-emitting device is sealed with a transparent resin.

6. The light-emitting apparatus of claim 5, wherein the electrode of said light-emitting device is connected to said conductive pattern with a conductive adhesive agent.

7. The light-emitting apparatus of claim 2, wherein said ceramic package contains aluminum nitride.

8. A light-emitting apparatus comprising:
a ceramic package;
a conductive pattern formed on a mounting area of said ceramic package;
a light-emitting device mounted on the mounting area of said ceramic package, including an electrode provided on a bottom of said light-emitting device that faces said conductive pattern and is connected to said conductive pattern; and
a metal layer below the mounting area and buried in said ceramic package, a thickness between a top surface of said metal layer and the mounting area being smaller than a thickness between the top surface of said metal layer and a bottom surface of said ceramic package.

9. The light-emitting apparatus of claim 8, further comprising a diode provided on said ceramic package and electrically connected to said light-emitting device.

10. The light-emitting apparatus of claim 9, wherein said diode is a light-emitting diode.

11. The light-emitting apparatus of claim 9, wherein said ceramic package contains alumina.

12. The light-emitting apparatus of claim 11, wherein said light-emitting device is sealed with a transparent resin.

13. The light-emitting apparatus of claim 12, wherein the electrode of said light-emitting device is connected to said conductive pattern with a conductive adhesive agent.

14. The light-emitting apparatus of claim 9, wherein said ceramic package contains aluminum nitride.

* * * * *